(12) United States Patent
Lee et al.

(10) Patent No.: US 12,360,638 B2
(45) Date of Patent: Jul. 15, 2025

(54) DISPLAY DEVICE

(71) Applicant: Samsung Display Co., Ltd., Yongin-Si (KR)

(72) Inventors: Jeongyoon Lee, Yongin-si (KR); Kyungho Kim, Yongin-si (KR); Ok-Kyung Park, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/391,542

(22) Filed: Dec. 20, 2023

(65) Prior Publication Data
US 2024/0211080 A1    Jun. 27, 2024

(30) Foreign Application Priority Data
Dec. 21, 2022    (KR) .................. 10-2022-0180713

(51) Int. Cl.
*G06F 3/044* (2006.01)
*G06F 3/041* (2006.01)
(Continued)

(52) U.S. Cl.
CPC .......... *G06F 3/0443* (2019.05); *G06F 3/0412* (2013.01); *G06F 3/0446* (2019.05); *G09G 3/3233* (2013.01); *H10K 59/122* (2023.02); *G06F 2203/04111* (2013.01); *G06F 2203/04112* (2013.01); *G09G 2300/0819* (2013.01);
(Continued)

(58) Field of Classification Search
CPC .... H10K 59/122; H10K 59/131; H10K 59/40; G09G 2300/0819; G09G 2300/0842; G09G 2320/0257; G09G 2354/00; G09G 3/3233; G06F 2203/04111; G06F 2203/04112; G06F 3/0412; G06F 3/0443; G06F 3/0446
See application file for complete search history.

(56) References Cited

U.S. PATENT DOCUMENTS
8,648,337 B2    2/2014    Hsieh
10,879,316 B2    12/2020    Lee et al.
(Continued)

FOREIGN PATENT DOCUMENTS
CN    103280539 A    9/2013
KR    10-2016-0006110 A    1/2016
(Continued)

*Primary Examiner* — Robin J Mishler
(74) *Attorney, Agent, or Firm* — KILE PARK REED & HOUTTEMAN PLLC

(57) ABSTRACT

A display device includes a display layer that displays an image, and a sensing layer that is disposed on the display layer and includes a plurality of first sensing electrodes and a plurality of second sensing electrodes intersecting the plurality of first sensing electrodes. The display layer may include a transistor, a light emitting device, which includes a first electrode, an intermediate electrode disposed on the first electrode, and a second electrode disposed on the intermediate electrode, a pixel defining film, in which an emission opening portion overlapping a portion of the first electrode is defined, and a separator which is disposed on the pixel defining film and interrupting a continued formation of the second electrode. The plurality of first sensing electrodes and the plurality of second sensing electrodes may overlap the separator.

32 Claims, 20 Drawing Sheets

(51) Int. Cl.
*G09G 3/3233* (2016.01)
*H10K 59/122* (2023.01)

(52) U.S. Cl.
CPC ............... *G09G 2300/0842* (2013.01); *G09G 2320/0257* (2013.01); *G09G 2354/00* (2013.01)

(56) References Cited

U.S. PATENT DOCUMENTS

| | | | |
|---|---|---|---|
| 11,042,237 B2 | 6/2021 | Lee et al. | |
| 2008/0258614 A1* | 10/2008 | Ha | H10K 50/86 |
| | | | 359/485.05 |
| 2020/0235172 A1* | 7/2020 | Lee | H10K 59/122 |
| 2021/0020078 A1* | 1/2021 | Park | H10K 59/8731 |

FOREIGN PATENT DOCUMENTS

| | | | |
|---|---|---|---|
| KR | 10-2020-0091059 A | 7/2020 | |
| KR | 10-2020-0108148 A | 9/2020 | |

* cited by examiner

DISPLAY DEVICE

CROSS-REFERENCE TO RELATED APPLICATIONS

This U.S. non-provisional patent application claims priority under 35 U.S.C. § 119 to Korean Patent Application No. 10-2022-0180713 filed on Dec. 21, 2022, the entire content of which is hereby incorporated by reference.

BACKGROUND

The present disclosure herein relates to a display device, and more particularly, to a display device with improvement in afterimage phenomenon.

A multimedia electronic device such as a television, a mobile phone, a tablet computer, a computer, a navigation unit, and a game console, includes a display panel for displaying an image.

The display panel includes light emitting devices and a circuit for driving the light emitting devices. The light emitting devices included in the display panel emit light and generate an image in response to a voltage applied to the circuit. In order to improve reliability of the display panel, research on connection of the light emitting devices and the circuit is carried out.

SUMMARY

The present disclosure provides a display device with improvement in afterimage phenomenon.

In one aspect, the present disclosure pertains to a display device including a display layer that displays an image, and a sensing layer that is disposed on the display layer and includes a plurality of first sensing electrodes and a plurality of second sensing electrodes intersecting the plurality of first sensing electrodes. The display layer may include a transistor, a light emitting device, which includes a first electrode, an intermediate layer disposed on the first electrode, and a second electrode disposed on the intermediate layer, a pixel defining film, in which an emission opening portion above the first electrode is defined, and a separator which is disposed on the pixel defining film and interrupts a continuous formation of the second electrode. The plurality of first sensing electrodes and the plurality of second sensing electrodes may overlap the separator.

In an embodiment, the display layer may include a first connection part connected to the light emitting device, a second connection part connected to the transistor, and a connection wiring that electrically connects the light emitting device and the transistor to each other. An emission region corresponding to the emission opening portion may be defined in the display layer.

In an embodiment, each of the plurality of first sensing electrodes may include a plurality of first sensing patterns and a plurality of first bridge patterns disposed on a different layer from the plurality of first sensing patterns. Adjacently-positioned first sensing patterns of the plurality of first sensing patterns may be electrically connected to each other by two first bridge patterns of the plurality of first bridge patterns.

In an embodiment, each of the plurality of first bridge patterns may be spaced apart from a plurality of first connection parts with at least one emission region therebetween.

In an embodiment, each of the plurality of first bridge patterns may include a bending portion, and the bending portion may have a width that is greater than a width of the emission region, when viewed on a plan view.

In an embodiment, each of the plurality of second sensing electrodes may include a plurality of sensing portions and a connection part electrically connected to the plurality of sensing portions, and the plurality of second sensing electrodes may be disposed on the same layer as the plurality of first sensing patterns.

In an embodiment where there are a plurality of emission regions, each of the plurality of first sensing electrodes and the plurality of second sensing electrodes may include mesh lines. A first mesh line of one first sensing electrode of the plurality of first sensing electrodes and a second mesh line of one second sensing electrode of the plurality of second sensing electrodes, the second mesh line and the first mesh line may be spaced apart from each other between two emission regions of the plurality of emission regions, the two emission regions being positioned adjacent to each other in a first direction, and each of the first mesh line and the second mesh line may extend in a second direction crossing the first direction.

In an embodiment, the first mesh line and the second mesh line may be spaced apart from each other between a plurality of first connection parts.

In an embodiment, the first mesh line and the second mesh line may be spaced apart from each other in the second direction.

In an embodiment, the first mesh line and the second mesh line may overlap a first portion of the separator, which extends in the second direction.

In an embodiment, each of a width of the first mesh line and a width of the second mesh line may be the same as or narrower than a width of the separator.

In an embodiment, the first mesh line and the second mesh line may be spaced apart from each other in the first direction.

In an embodiment, the separator may include a first separator and a second separator, which is spaced apart from the first separator in the first direction, and the first separator may overlap the first mesh line, and the second separator may overlap the second mesh line.

In an embodiment, a width of the first mesh line may be the same as or narrower than a width of the first separator, and a width of the second mesh line may be the same as or narrower than a width of the second separator.

In an embodiment, each of the plurality of second sensing electrodes may include a plurality of second sensing patterns, and a plurality of second bridge patterns, wherein the plurality of second bridge patterns are disposed on a different layer from the plurality of second sensing patterns. Second bridge patterns of the plurality of second bridge patterns electrically connect adjacently-positioned second sensing patterns of the plurality of second sensing patterns.

In an embodiment, each of the plurality of second bridge patterns may be spaced apart from a plurality of first connection parts by the emission region positioned therebetween.

In an embodiment, portions of the two second sensing patterns may be spaced apart from each other between two connection parts of the plurality of first connection parts, which are adjacent to each other in a second direction, in the second direction.

In another aspect, the disclosure pertains to a display device that includes a display layer that displays an image, and a sensing layer that is disposed on the display layer and includes a plurality of first sensing electrodes and a plurality of second sensing electrodes intersecting the plurality of first sensing electrodes. The display layer may include a transistor, a light emitting device, which includes a first electrode, an intermediate layer disposed on the first electrode, and a second electrode disposed on the intermediate layer, a pixel defining film, in which an emission opening portion overlapping a portion of the first electrode is defined, and a separator which is disposed on the pixel defining film and interrupting a continuous formation of the second electrode. Each of the plurality of first sensing electrodes and the plurality of second sensing electrodes may include mesh lines, and each of the mesh lines may have a width that is the same to or narrower than a width of the separator.

In an embodiment, each of the plurality of first sensing electrodes may include a plurality of first sensing patterns, and a plurality of first bridge patterns disposed on a different layer from the plurality of first sensing patterns, and adjacently-positioned first sensing patterns of the plurality of first sensing patterns may be electrically connected to each other by two first bridge patterns of the plurality of first bridge pattern. Each of the plurality of second sensing electrodes may include a plurality of sensing portions and a connection part electrically connected to the plurality of sensing portions, and the plurality of second sensing electrodes may be disposed on the same layer as the plurality of first sensing patterns.

In an embodiment, the display layer may include a first connection part connected to the light emitting device, a second connection part connected to the transistor, and a connection wiring that electrically connects the light emitting device and the transistor to each other. An emission region corresponding to the emission opening portion may be defined in the display layer.

In an embodiment, each of the plurality of first bridge patterns may be spaced apart from a plurality of first connection parts by the emission region positioned therebetween.

In an embodiment, each of the plurality of first bridge patterns may include a bending portion, and the bending portion has a width that is greater than a width of the emission opening portion, when viewed on a plan view.

In an embodiment with a plurality of emission regions, a first mesh line of one first sensing electrode of the plurality of first sensing electrodes and a second mesh line of one second sensing electrode of the plurality of second sensing electrodes may be spaced apart from each other between two emission regions of a plurality of emission regions, wherein the two emission regions are adjacent to each other in a first direction, and each of the first mesh line and the second mesh line may extend in a second direction crossing the first direction, when viewed on a plan view.

In an embodiment, the first mesh line and the second mesh line may be spaced apart from each other between a plurality of first connection parts.

In an embodiment, the first mesh line and the second mesh line may be spaced apart from each other in the second direction, and the first mesh line and the second mesh line may overlap a first portion of the separator, which extends in the second direction.

In an embodiment, the first mesh line and the second mesh line may be spaced apart from each other in the first direction, and the separator may include a first separator and a second separator spaced apart from the first separator in the first direction. The first separator may overlap the first mesh line, and the second separator may overlap the second mesh line.

In an embodiment, a width of the first mesh line may be the same as or narrower than a width of the first separator, and a width of the second mesh line may be the same as or narrower than a width of the second separator.

In an embodiment, each of the plurality of first sensing electrodes may include a plurality of first sensing patterns, and a plurality of first bridge patterns disposed on a different layer from the plurality of first sensing patterns, and two first sensing patterns of the plurality of first sensing patterns, which are adjacent to each other, may be electrically connected to each other by two first bridge patterns of the plurality of first bridge pattern. Each of the plurality of second sensing electrodes may include a plurality of second sensing patterns, and a plurality of second bridge patterns disposed on a different layer from the plurality of second sensing patterns, and two second sensing patterns of the plurality of second sensing patterns, which are adjacent to each other, may be electrically connected to each other by two second bridge patterns of the plurality of second bridge pattern.

In an embodiment, each of the plurality of second bridge patterns may be spaced apart from a plurality of first connection parts by the emission region positioned therebetween when viewed on a plan view.

In an embodiment, portions of the two second sensing patterns may be spaced apart from each other in a second direction and positioned between two connection parts of the plurality of first connection parts, wherein the two connection parts are adjacent to each other in the second direction.

In yet another aspect, the disclosure pertains to a display device that includes a display layer that displays an image, and a sensing layer that is disposed on the display layer, and includes a plurality of first sensing electrodes and a plurality of second sensing electrodes intersecting the plurality of first sensing electrodes. The display layer may include a transistor, a light emitting device, which includes a first electrode, an intermediate layer disposed on the first electrode, and a second electrode disposed on the intermediate layer, a pixel defining film, in which an emission opening portion above the first electrode is defined, and a separator which is disposed on the pixel defining film and interrupts the continuous formation of the second electrode. Each of the plurality of first sensing electrodes and the plurality of second sensing electrodes includes mesh lines, and each of the mesh lines has a width that is the same as or narrower than a width of the separator.

Each of the plurality of first sensing electrodes may include a plurality of first sensing patterns, and a plurality of first bridge patterns disposed on a different layer from the plurality of first sensing patterns, and adjacently-positioned first sensing patterns of the plurality of first sensing patterns may be electrically connected to each other by two first bridge patterns of the plurality of first bridge patterns. Each of the plurality of first bridge patterns may be spaced apart from a plurality of first connection parts by an emission region corresponding to the emission opening portion that is positioned therebetween.

In yet another aspect, the disclosure pertains to a display device that includes a display layer that displays an image, and a sensing layer that is disposed on the display layer, and includes a plurality of first sensing electrodes and a plurality of second sensing electrodes intersecting the plurality of first sensing electrodes. The display layer may include a transistor, a light emitting device, which includes a first electrode, an intermediate layer disposed on the first electrode, and a second electrode disposed on the intermediate layer, a pixel defining film, in which an emission opening portion above the first electrode is defined, and a separator which is disposed on the pixel defining film and interrupts the continuous formation of the second electrode. Each of the plurality of first sensing electrodes includes a plurality of first sensing patterns, and a plurality of first bridge patterns are disposed on a different layer from the plurality of first sensing patterns, adjacently-positioned first sensing patterns of the plurality of first sensing patterns are electrically connected to each other by two first bridge patterns of the plurality of first bridge patterns, and each of the plurality of first bridge patterns is spaced apart from a plurality of first connection parts by an emission region corresponding to the emission opening portion positioned therebetween.

BRIEF DESCRIPTION OF THE FIGURES

The accompanying drawings are included to provide a further understanding of the inventive concept, and are incorporated in and constitute a part of this specification. The drawings illustrate embodiments of the inventive concept and, together with the description, serve to explain principles of the inventive concept. In the drawings.

DETAILED DESCRIPTION

Figure 1:
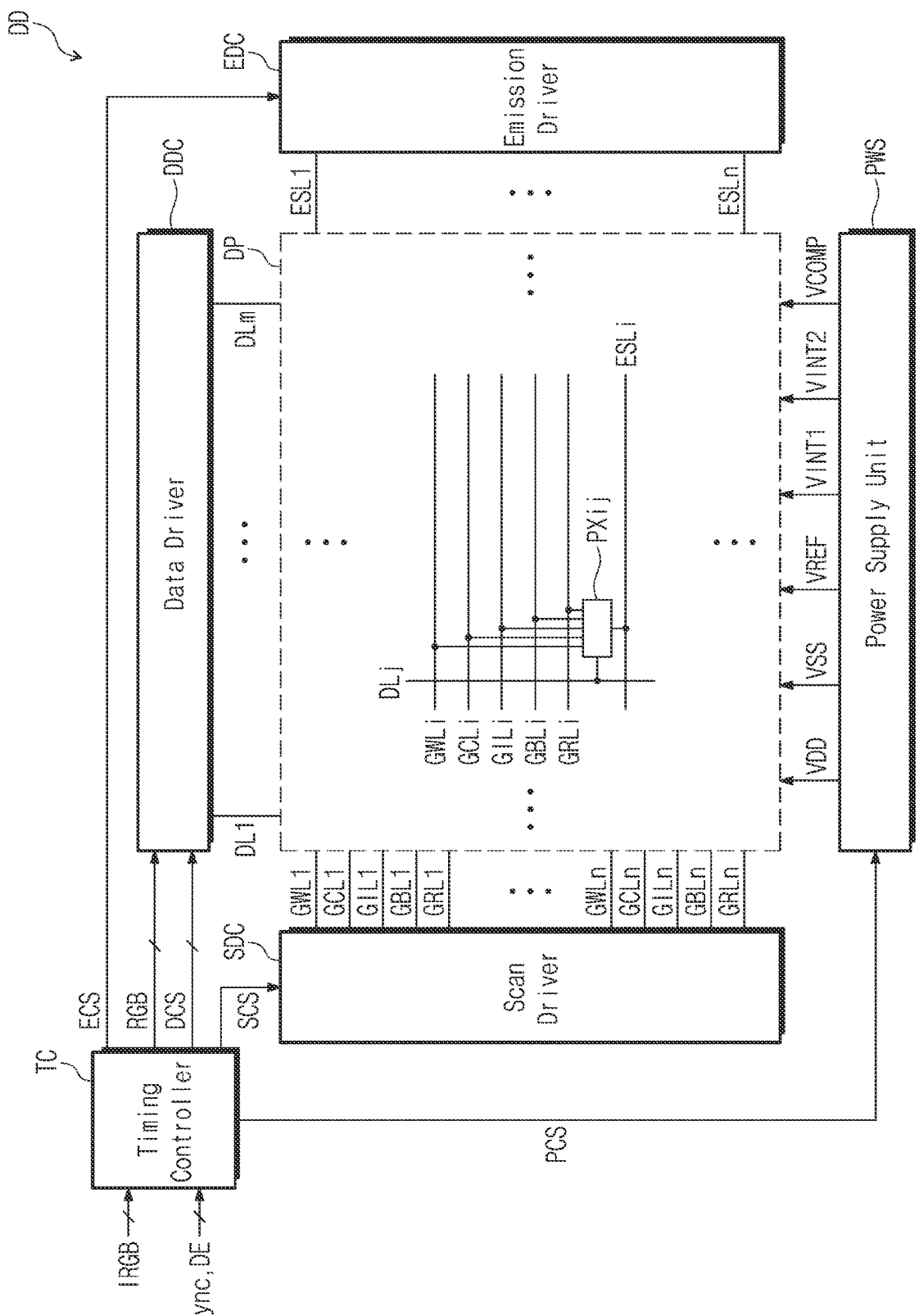
FIG. 1 is a block diagram of a display device according to an embodiment of the inventive concept.

It will be understood that when an element (or region, layer, section, etc.) is referred to as being "on", "connected to" or "coupled to" another element, it can be disposed directly on, connected or coupled to the other element or a third intervening elements may be disposed between the elements.

Like reference numbers or symbols refer to like elements throughout. In addition, in the drawings, the thickness, the ratio, and the dimension of elements are exaggerated for effective description of the technical contents. The term "and/or" includes one or more combinations which may be defined by relevant elements.

It will be understood that, although the terms first, second, etc. may be used herein to describe various elements, these elements should not be limited by these terms. These terms are only used to distinguish one element from another element. For example, a first element could be termed a second element without departing from the teachings of the present invention, and similarly, a second element could be termed a first element. As used herein, the singular forms are intended to include the plural forms as well, unless the context clearly indicates otherwise.

In addition, the terms, such as "below", "beneath", "on" and "above", are used for explaining the relation of elements shown in the drawings. The terms are relative concepts and are explained based on the direction shown in the drawing.

It will be further understood that the terms such as "includes" and "has", when used herein, specify the presence of stated features, numerals, steps, operations, elements, parts, or the combination thereof, but do not preclude the presence or addition of one or more other features, numerals, steps, operations, elements, parts, or the combination thereof.

The term "part" or "unit" means a software component or a hardware component for performing a specific function. The hardware component may include, for example, a field-programmable gate array (FPGA) or an application-specific integrated circuit (ASIC). The software component may refer to executable code and/or data used by executable code in an addressable storage medium. Thus, the software components may be, for example, object-oriented software components, class components and task components, and may include processes, functions, attributes, procedures, sub-routines, segments of program code, drivers, firmware, microcode, circuitry, data, databases, data structures, tables, arrays, or variables.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments of the inventive concept will be described with reference to the accompanying drawings.

FIG. 1 is a block diagram of a display device according to an embodiment of the inventive concept.

Referring to FIG. 1, the display device DD may include a display panel DP, panel driving units SDC, EDC and DDC, a power supply unit PWS, and a timing controller TC. In this embodiment, the display panel DP is described as a light emitting display panel. The light emitting display panel may include an organic light emitting display panel, an inorganic light emitting display panel, or a quantum-dot light emitting display panel. The organic light emitting display panel will be described in detail as an example in an embodiment to be described later. The panel driving units may include a scan driver SDC, an emission driver EDC, and a data driver DDC.

The display panel DP may include scan lines GWL1 to GWLn, GCL1 to GCLn, GIL1 to GILn, GBL1 to GBLn and GRL1 to GRLn, emission lines ESL1 to ESLn, and data lines DL1 to DLm. The display panel DP may include a plurality of pixels connected to the can lines GWL1 to GWLn, GCL1 to GCLn, GIL1 to GILn, GBL1 to GBLn and GRL1 to GRLn, the emission lines ESL1 to ESLn, and the data lines DL1 to DLm (here, m or n is an integer of 1 or greater).

For example, a pixel PXij (here, i or j is an integer of 1 or greater) disposed in an i-th horizontal line (or i-th pixel row) and a j-th vertical line (or j-th pixel row) may be connected to the i-th first scan line GWLi (or write scan line), the i-th second scan line GCLi (or compensation scan line), the i-th third scan line GILi (or first initialization scan line), the i-th fourth scan line GBLi (or second initialization scan line), the i-th fifth scan line GRLi (or reset scan line), the j-th data line DLj, and the i-th emission line ESLi.

The pixel PXij may include a plurality of light emitting devices, a plurality of transistors, and a plurality of capacitors. The pixel PXij may receive, through the power supply unit PWS, a first power supply voltage VDD, a second power supply voltage VSS, a third power supply voltage VREF (or reference voltage), a fourth power supply voltage VINT1 (or first initialization voltage), a fifth power supply voltage VINT2 (or second initialization voltage), and a sixth power supply voltage VCOMP (or compensation voltage).

Each of the first power supply voltage VDD and the second power supply voltage VSS may have a voltage value that is set so that a current flows through the light emitting device to emit light. For example, the first power supply voltage VDD may be set to a voltage higher than the second power supply voltage VSS.

The third power supply voltage VREF may be a voltage for initializing a gate of a driving transistor included in the pixel PXij. The third power supply voltage VREF may be used for representing a predetermined gray level by using a voltage difference with a data signal. For this end, the third power supply voltage VREF may be set to a predetermined voltage in a voltage range of the data signal.

The fourth power supply voltage VINT1 may be a voltage for initializing the capacitor included in the pixel PXij. The fourth power supply voltage VINT1 may be set to a voltage lower than the third power supply voltage VREF. For example, the fourth power supply voltage VINT1 may be set to a voltage lower than a difference between the third power supply voltage VREF and a threshold voltage of the driving transistor. However, an embodiment of the inventive concept is not limited thereto.

The fifth power supply voltage VINT2 may be a voltage for initializing a cathode of the light emitting device included in the pixel PXij. The fifth power supply voltage VINT2 may be set to a voltage lower than the first power supply voltage VDD or the fourth power supply voltage VINT1, or may be set to a voltage similar to or the same as the third power supply voltage VREF. However, an embodiment of the inventive concept is not limited thereto, and the fifth power supply voltage VINT2 may be set to a voltage similar to or the same as the first power supply voltage VDD.

The sixth power supply voltage VCOMP may supply a predetermined current to the driving transistor during compensation of the threshold voltage of the driving transistor.

FIG. 1 illustrates that all of the first to sixth power supply voltages VDD, VSS, VREF, VINT1, VINT2 and VCOMP are supplied from the power supply unit PWS. However, an embodiment of the inventive concept is not limited thereto. For example, the first power supply voltage VDD and the second power supply voltage VSS may be all supplied irrespective of a structure of the pixel PXij, and at least one of the third power supply voltage VREF, the fourth power supply voltage VINT1, the fifth power supply voltage VINT2, or the sixth power supply voltage VCOMP may not be supplied depending on the structure of the pixel PXij.

In this embodiment of the inventive concept, the signal lines connected to the pixel PXij may be variously set to correspond to a circuit structure of the pixel PXij.

The scan driver SDC may receive a first control signal SCS from the timing controller TC and supply a scan signal to each of first power scan lines GWL1 to GWLn, second power scan lines GCL1 to GCLn, third power scan lines GIL1 to GILn, fourth power scan lines GBL1 to GBLn, and fifth power scan lines GRL1 to GRLn based on the first control signal SCS.

The scan signal may be set to a voltage with which transistors, each of which receives the scan signal, are turned on. For example, the scan signal supplied to a p-type transistor may be set to a logic low level, and the scan signal supplied to an n-type transistor may be set to a logic high level. Hereinafter, the meaning of "scan signal being supplied" may be understood as scan signal being supplied at a logic level at which the transistor controlled by the scan signal is turned on.

For convenience of explanation, FIG. 1 illustrates that the scan driver SDC has a single configuration, but an embodiment of the inventive concept is not limited thereto. According to an embodiment, a plurality of scan drivers may be included in order to supply the scan signal to each of the first power scan lines GWL1 to GWLn, the second power scan lines GCL1 to GCLn, the third power scan lines GIL1 to GILn, the fourth power scan lines GBL1 to GBLn, and the fifth power scan lines GRL1 to GRLn.

The emission driver EDC may supply an emission signal to the emission lines ESL1 to ESLn based on a second control signal ECS. For example, the emission signal may be sequentially supplied to the emission lines ESL1 to ESLn.

The transistors connected to the emission lines ESL1 to ESLn according to an embodiment of the inventive concept may be provided as n-type transistors. Here, the emission signals supplied to the emission lines ESL1 to ESLn may be set to a gate-off voltage. The transistors, each of which receives the emission signal, may be set so that the transistor turn off in response to receiving the emission signal, but otherwise the transistor is in a turned-on state.

The second control signal ECS may include an emission start signal and clock signals, and the emission driver EDC may be embodied as a shift register that uses the clock signals to sequentially shift the emission start signal of a pulse type and sequentially generates and outputs the emission signal of a pulse type.

The data driver DDC may receive a third control signal DCS and image data RGB from the timing controller TC. The data driver DDC may convert the image data RGB of a digital type into an analog data signal (i.e., data signal). The data driver DDC may supply the data signal to the data lines DL1 to DLm corresponding to the third control signal DCS.

The third control signal DCS may include a data enable signal, a horizontal start signal, a data clock signal, etc., which instructs output of a valid data signal. For example, the data driver DDC may include a shift register, which is motivated by the data clock signal and shifts the horizontal start signal to generate a sampling signal, a latch that latches the image data RGB in response to the sampling signal, a digital-to-analog converter (or decoder) that converts the latched image data RGB (e.g., data of a digital type) into data signals of an analog type, and buffers (or amplifiers) that output the data signals to the data lines DL1 to DLm.

The power supply unit PWS may supply, to the display panel DP, the first power supply voltage VDD, second power supply voltage VSS, and third power supply voltage VREF for driving the pixel PXij. The power supply unit PWS may also supply, to the display panel DP, at least one of the fourth power supply voltage VINT1, the fifth power supply voltage VINT2, or the sixth power supply voltage VCOMP.

In one example, the power supply unit PWS may supply, to the display panel DP, the first power supply voltage VDD, the second power supply voltage VSS, the third power supply voltage VREF, the fourth power supply voltage VINT1, the fifth power supply voltage VINT2, and the sixth power supply voltage VCOMP through a first power line VDL (see FIG. 2A), a second power line VSL (see FIG. 2A), a third power line VRL (or reference voltage line) (see FIG. 2A), a fourth power line VIL1 (or first initialization voltage line) (see FIG. 2A), a fifth power line VIL2 (or second initialization voltage line) (see FIG. 2A), and a sixth power line VCL (or compensation voltage line) (see FIG. 2A), respectively.

The timing controller TC may generate the first control signal SCS, the second control signal ECS, the third control signal DCS or a fourth control signal PCS based on input image data IRGB, a synchronization signal Sync (e.g., a vertical sync signal, a horizontal sync signal, or the like), a data enable signal DE, the clock signal, and so on. The first control signal SCS may be supplied to the scan driver SDC, the second control signal ECS may be supplied to the emission driver EDC, the third control signal DCS may be supplied to the data driver DDC, and the fourth control signal PCS may be supplied to the power supply unit PWS. The timing controller TC may rearrange the input image data IRGB corresponding to the arrangement of the pixel PXij in the display panel DP and generate the image data RGB (or frame data).

The scan driver SDC, the emission driver EDC, the data driver DDC, the power supply unit PWS, and/or the timing controller TC may be provided directly in the display panel DP, or may be provided in the form of a separate driving chip and connected to the display panel DP. Alternatively, at least two of the scan driver SDC, the emission driver EDC, the data driver DDC, the power supply unit PWS, and the timing controller TC may be provided as one driving chip. For example, the data driver DDC and the timing controller TC may be provided as one driving chip.

The display device DD according to an embodiment is described with reference to FIG. 1 hereinabove, but the display device according to an embodiment of the inventive concept is not limited thereto. The signal lines may be further added or omitted according to the configuration of the pixel. Alternatively, a connection relationship between one pixel and the signal lines may be changed. When one of the signal lines is omitted, another signal line may be replaced with the omitted signal line.

Figure 2A:
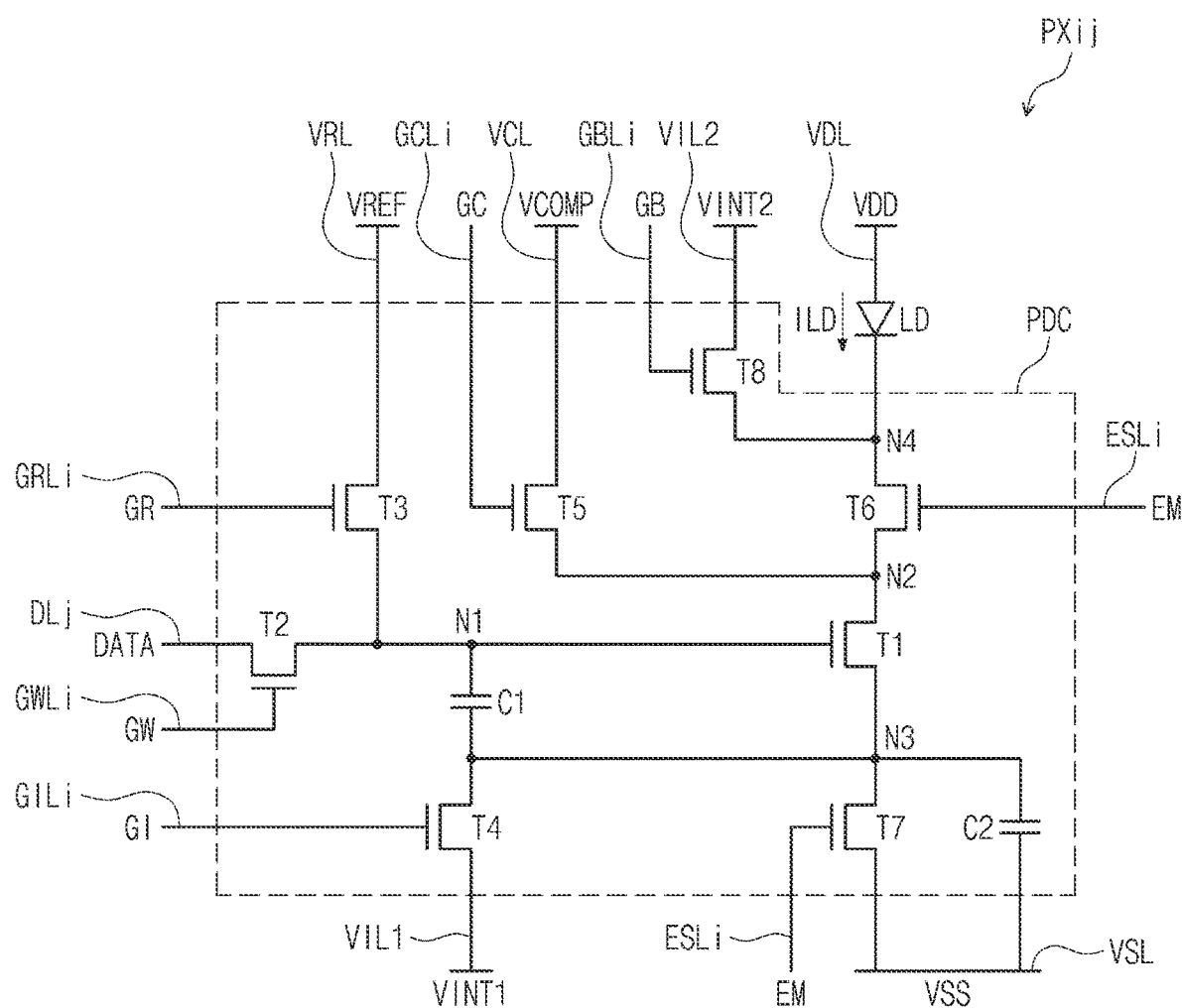
FIGS. 2A and 2B are equivalent circuit diagrams of a pixel according to an embodiment.
Figure 2B:
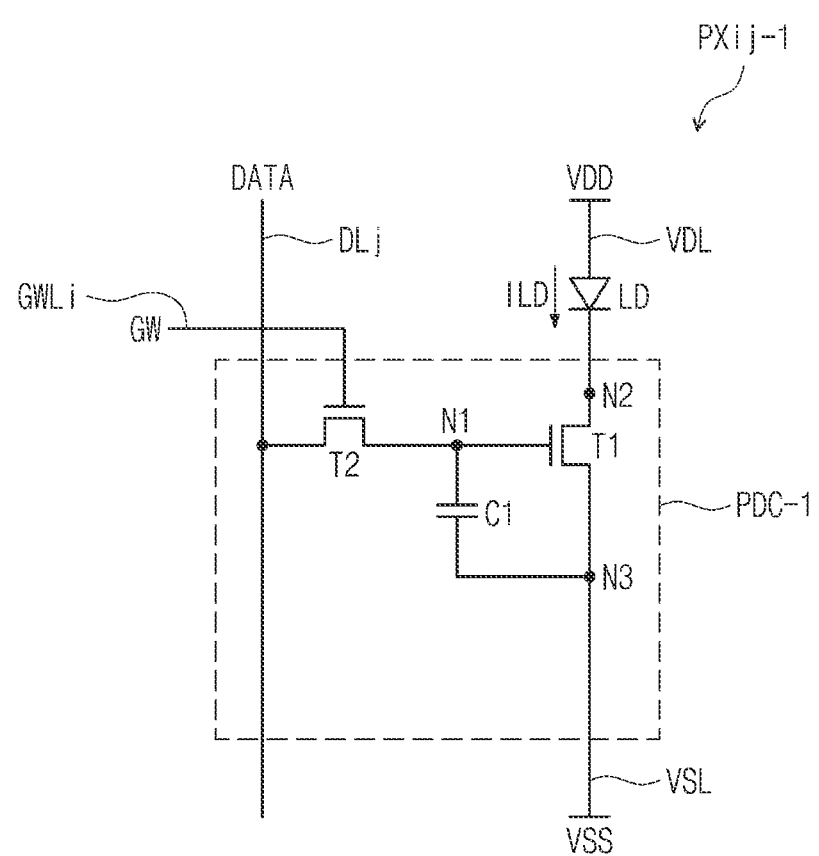

FIGS. 2A and 2B are equivalent circuit diagrams of a pixel PXij and PXij-1 according to an embodiment. FIGS. 2A and 2B exemplarily illustrate equivalent circuit diagrams of pixels PXij and PXij-1, each of which is connected to the i-th first scan line GWLi (hereinafter referred to as the first scan line) and connected to the j-th data line DLj (hereinafter referred to as the data line).

As illustrated in FIG. 2A, the pixel PXij includes a light emitting device LD and a pixel driver PDC. The light emitting device LD is connected to a first power line VDL and the pixel driver PDC.

The pixel driver PDC may be connected to a plurality of scan lines GWLi, GCLi, GILi, GBLi and GRLi, the data line DLj, an emission line ESLi, and a plurality of power supply voltage lines VDL, VSL, VIL1, VIL2, VRL and VCL. The pixel driver PDC may include first to eighth transistors T1, T2, T3, T4, T5, T6, T7 and T8, a first capacitor C1, and a second capacitor C2. Hereinafter, an example is described in which each of the first to eighth transistors T1, T2, T3, T4, T5, T6, T7 and T8 is an n-type transistor. However, an embodiment of the inventive concept is not limited thereto, and some of the first to eighth transistors T1 to T8 may be n-type transistors and the others may be p-type transistors. Alternatively, each of the first to eighth transistors T1 to T8 may be a p-type transistor and is not limited to any one embodiment.

A gate of a first transistor T1 may be connected to a first node N1. A first electrode of the first transistor T1 may be connected to a second node N2, and a second electrode thereof may be connected to a third node N3. The first transistor T1 may be a driving transistor. The first transistor T1 may control a driving current ILD flowing from a first power line VDL through the light emitting device LD to a second power line VSL in response to a voltage of the first node N1. Here, a first power supply voltage VDD may be set to a voltage having a higher potential level than a second power supply voltage VSS.

In the present disclosure, "a transistor and a signal line or a transistor and a transistor being electrically connected to each other" means "a source, a drain, and a gate of the transistor being integrally formed with the signal line or electrically connected to each other through an intervening part.

A second transistor T2 may include a gate connected to a write scan line GWLi, a first electrode connected to the data line DLj, and a second electrode connected to the first node N1. The second transistor T2 may supply a data signal DATA to the first node N1 in response to a write scan signal GW delivered through the write scan line GWLi. When the write scan signal GW is supplied to the write scan line GWLi, the second transistor T2 may be turned on to electrically connect the data line Dlj and the first node N1 to each other.

A third transistor T3 may be connected between the first node N1 and a reference voltage line VRL. A first electrode of the third transistor T3 may receive a reference voltage VREF through the reference voltage line VRL, and a second electrode of the third transistor T3 may be connected to the first node N1. In this embodiment, a gate of the third transistor T3 may receive a reset scan signal GR through the i-th fifth scan line GRLi (hereinafter referred to as the fifth scan line). When the reset scan signal GR is supplied to the reset scan line GRLi, the third transistor T3 may be turned on and provide the first node N1 with the reference voltage VREF.

A fourth transistor T4 may be connected between the third node N3 and a first initialization voltage line VIL1. A first electrode of the fourth transistor T4 may be connected to the third node N3, and a second electrode of the fourth transistor T4 may be connected to the first initialization voltage line VIL1 that provides a first initialization voltage VINT1. The fourth transistor T4 may be referred to as a first initialization transistor. A gate of the fourth transistor T4 may receive a first initialization scan signal GI through the i-th third scan line GILi (hereinafter referred to as the third scan line). When the first initialization scan signal GI is supplied to the first initialization scan line GILi, the fourth transistor T4 may be turned on, and the first initialization voltage VINT1 is supplied to the third node N3.

A fifth transistor T5 may be connected between a compensation voltage line VCL and the second node N2. A first electrode of the fifth transistor T5 may receive a compensation voltage VCOMP through the compensation voltage line VCL, and a second electrode of the fifth transistor T5 may be connected to the second node N2 and electrically connected to the first electrode of the first transistor T1. A gate of the fifth transistor T5 may receive a compensation scan signal GC through the i-th second scan line GCLi (hereinafter referred to as the second scan line). When the compensation scan signal GC is supplied to the compensation scan line GCLi, the fifth transistor T5 may be turned on and provide the second node N2 with the compensation voltage VCOMP. When the compensation scan signal GC is supplied to the compensation scan line GCLi, the fifth transistor T5 may be turned on, providing the second node N2 with the compensation voltage VCOMP and causing a threshold voltage of the first transistor T1 to be compensated for a compensation period.

A sixth transistor T6 may be connected between the first transistor T1 and the light emitting device LD. Specifically, a gate of the sixth transistor T6 may receive an emission signal EM through the i-th emission line ESLi (hereinafter referred to as the emission line). A first electrode of the sixth transistor T6 may be connected to a cathode of the light emitting device LD through a fourth node N4, and a second electrode of the sixth transistor T6 may be connected to the first electrode of the first transistor T1 through the second node N2. The sixth transistor T6 may be referred to as a first emission control transistor. When the emission signal EM is supplied to the emission line ESLi, the sixth transistor T6 may be turned on to electrically connect the light emitting device LD and the first transistor T1 to each other.

A seventh transistor T7 may be connected between the second power line VSL and the third node N3. A first electrode of the seventh transistor T7 may be connected to the second electrode of the first transistor T1 through the third node N3, and a second electrode of the seventh transistor T7 may receive the second power supply voltage VSS through the second power line VSL. A gate of the seventh transistor T7 may be electrically connected to the emission line ESLi. The seventh transistor T7 may be referred to as a second emission control transistor. In response to the emission signal EM being supplied to the emission line ESLi, the seventh transistor T7 may be turned on and electrically connect the second electrode of the first transistor T1 to the second power line VSL.

Although the embodiment of FIG. 2A illustrates that the sixth transistor T6 and the seventh transistor T7 are connected to the same emission line ESLi and turned on in response to the emission signal EM, this is an example. The sixth transistor T6 and the seventh transistor T7 may be turned on independently of each other in response to different signals operating independently of each other. Alternatively, one of the sixth transistor T6 and the seventh transistor T7 may be omitted in the pixel driver PDC according to an embodiment of the inventive concept.

An eighth transistor T8 may be connected between a second initialization voltage line VIL2 and the fourth node N4. That is, the eighth transistor T8 may include a gate connected to the i-th fourth scan line GBLi (hereinafter referred to as the fourth scan line), a first electrode connected to the second initialization voltage line VIL2, and a second electrode connected to the fourth node N4. The eighth transistor T8 may be referred to as a second initialization transistor. The eighth transistor T8 may supply a second initialization voltage VINT2 to the fourth node N4 corresponding to the cathode of the light emitting device LD in response to a second initialization scan signal GB delivered through the second initialization scan line GBLi. The cathode of the light emitting device LD may be initialized by the second initialization voltage VINT2.

In this embodiment, some of the second to eighth transistors T2, T3, T4, T5, T6, T7 and T8 may be simultaneously turned on in response to the same scan signal. For example, the eighth transistor T8 and the fifth transistor T5 may be simultaneously turned on in response to the same scan signal. For example, the eighth transistor T8 and the fifth transistor T5 may operate in response to the same compensation scan signal GC. The eighth transistor T8 and the fifth transistor T5 may be simultaneously on/off in response to the same compensation scan signal GC. Such case may be due to the compensation scan line GCLi and the second initialization scan line GBLi being provided as a single scan line. Accordingly, the initialization of the cathode of the light emitting device LD and the threshold voltage compensation of the first transistor T1 may be carried out at the same time. However, this is illustrated as an example, and an embodiment of the inventive concept is not limited to any one embodiment.

According to the present disclosure, the initialization of the cathode of the light emitting device LD and the threshold voltage compensation of the first transistor T1 may be carried out by applying the same power supply voltage. For example, the compensation voltage line VCL and the second initialization voltage line VIL2 may be provided as substantially a single power supply voltage line. Such case may be due to the cathode initialization operation and the compensation operation of the driving transistor being carried out with one power supply voltage and thus, the driver design may be simplified. However, this is an example, and an embodiment of the inventive concept is not limited to any one embodiment.

The first capacitor C1 may be disposed between the first node N1 and the third node N3. The first capacitor C1 may store a difference in the voltages between the first node N1 and the third node N3. The first capacitor C1 may be referred to as a storage capacitor.

The second capacitor C2 may be disposed between the third node N3 and the second power line VSL. That is, one electrode of the second capacitor C2 may be connected to the second power line VSL that receives the second power supply voltage VSS, and the other electrode of the second capacitor C2 may be connected to the third node N3. The second capacitor C2 may store a charge corresponding to a difference voltage between the second power supply voltage VSS and the second node N2. The second capacitor C2 may be referred to as a hold capacitor. The second capacitor C2 may have a higher storage capacity than the first capacitor C1. Accordingly, the second capacitor C2 may minimize a voltage change of the third node N3 in response to a voltage change of the first node N1.

In this embodiment, the light emitting device LD may be connected to the pixel driver PDC through the fourth node N4. The light emitting device LD may include an anode connected to the first power line VDL and the cathode opposing the anode. In this embodiment, the light emitting device LD may be connected to the pixel driver PDC through the cathode. That is, in the pixel PXij according to an embodiment of the inventive concept, a connection node to which each of the light emitting device LD and the pixel driver PDC is connected may be the fourth node N4, and the fourth node N4 may correspond to a connection node between the first electrode of the sixth transistor T6 and the cathode of the light emitting device LD. Accordingly, potential of the fourth node N4 may substantially correspond to cathode potential of the light emitting device LD.

Specifically, the anode of the light emitting device LD may be connected to the first power line VDL and the first power supply voltage VDD that is a constant voltage may be applied to the anode, and the cathode may be connected to the first transistor T1 through the sixth transistor T6. That is, in this embodiment in which each of the first to eighth transistors T1 to T8 is an n-type transistor, the potential of the third node N3 corresponding to the source of the first transistor T1 that is a driving transistor may not be directly affected by a property of the light emitting device LD. Thus, even when the light emitting device LD deteriorates, the effect of the deterioration on a gate-source voltage (Vgs) of the transistors included in the pixel driver PDC, particularly the driving transistor, is reduced. That is, an amount of the driving current change from the deterioration of the light emitting device LD may be reduced and thus, image-sticking of the display panel according to a usage time increase may be reduced. As a result, the device lifetime may be extended.

Alternatively, as illustrated in FIG. 2B, the pixel PXij-1 may include a pixel driver PDC-1, which includes two transistors T1 and T2 and a capacitor C1. The pixel driver PDC-1 may be connected to a light emitting device LD, a write scan line GWLi, a data line DLj, and a second power line VSL. The pixel driver PDC-1 illustrated in FIG. 2B may be the pixel driver PDC illustrated in FIG. 2A, without the third to eighth transistors T3 to T8 and the second capacitor C2.

In the pixel driver PDC-1, each of first and second transistors T1 and T2 may be an n-type or p-type transistor. In this embodiment, an n-type transistor is described as an example of each of the first and second transistors T1 and T2.

The first transistor T1 may include a gate connected to a first node N1, a first electrode connected to a second node N2, and a second electrode connected to a third node N3. The second node N2 may be a node connected to a first power line VDL side, and the third node N3 may be a node connected to a second power line VSL side. The first transistor T1 may be connected to the light emitting device LD through the second node N2 and connected to the second power line VSL through the third node N3. The first transistor T1 may be a driving transistor.

The second transistor T2 may include a gate, which receives a write scan signal GW through the write scan line GWLi, a first electrode connected to the data line DLj, and a second electrode connected to the first node N1. The second transistor T2 may supply a data signal DATA to the first node N1 in response to the write scan signal GW delivered through the write scan line GWLi.

The capacitor C1 may include an electrode connected to the first node N1 an electrode connected to the third node N3. The capacitor C1 may store the data signal DATA delivered to the first node N1.

The light emitting device LD may include an anode and a cathode. In this embodiment, the anode of the light emitting device LD is connected to the first power line VDL, and the cathode is connected to the pixel driver PDC-1 through the second node N2. In this embodiment, the cathode of the light emitting device LD may be connected to the first transistor T1. The light emitting device LD may emit light in response to an amount of a current flowing through the first transistor T1 of the pixel driver PDC-1.

In this embodiment in which each of the first and second transistors T1 and T2 is an n-type transistor, the second node N2 to which each of the cathode of the light emitting device LD and the pixel driver PDC-1 is connected may correspond to a drain of the first transistor T1. That is, a change of a gate-source voltage (Vgs) of the first transistor T1, which is caused by the light emitting device LD, may be prevented. Accordingly, an amount of the driving current change from the deterioration of the light emitting device LD and image-sticking of the display panel according to a usage time increase may be reduced, resulting in extended device lifetime.

FIGS. 2A and 2B illustrate a circuit of each of the pixel drivers PDC and PDC-1 according to an embodiment of the inventive concept. The number or arrangement relationship of the transistors and the number or arrangement relationship of the capacitor may be varied as long as the circuit is a circuit connected to the cathode of the light emitting device LD. The display panel according to an embodiment of the inventive concept is not limited to any one embodiment.

Figure 3A:
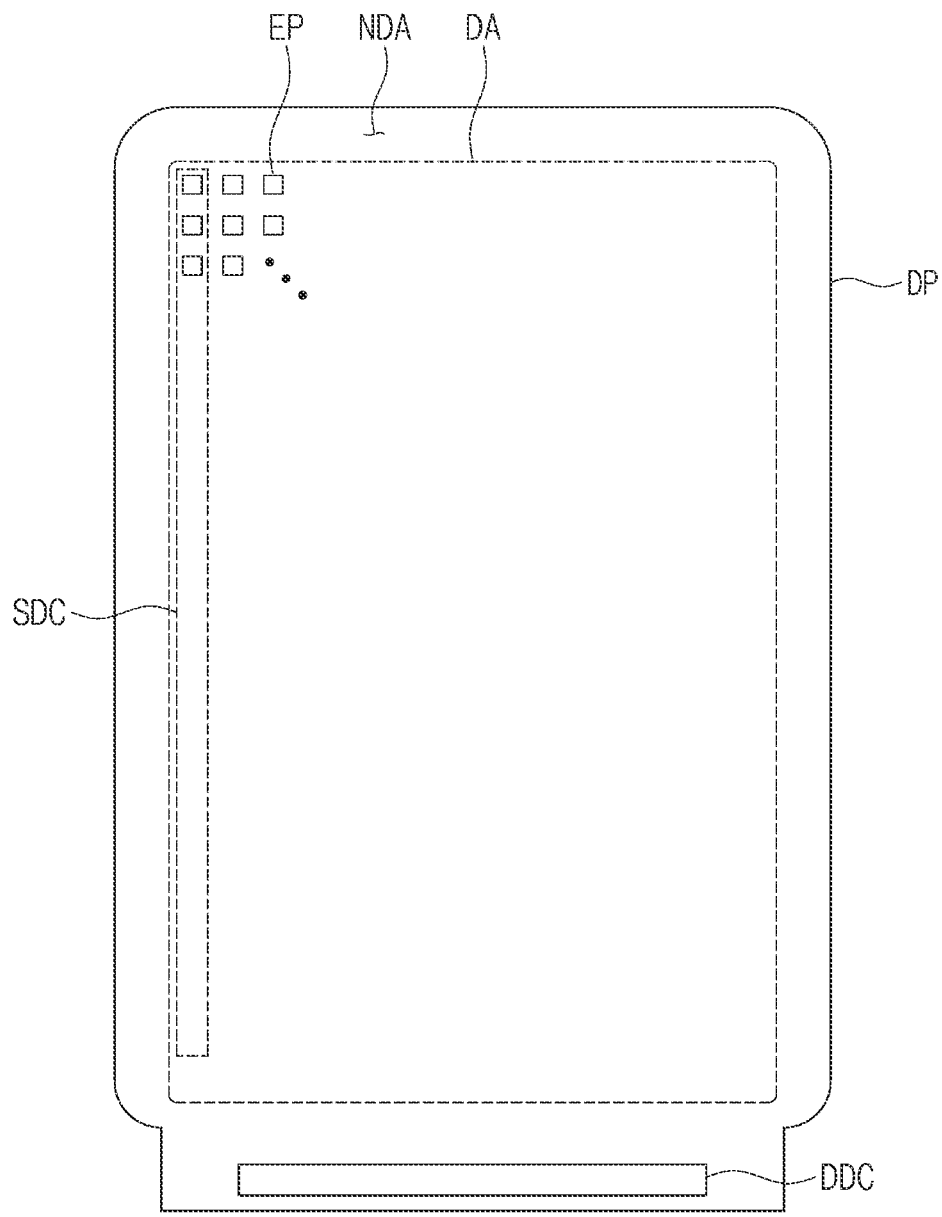
FIGS. 3A and 3B are plan views schematically illustrating a display panel according to an embodiment of the inventive concept.
Figure 3B:
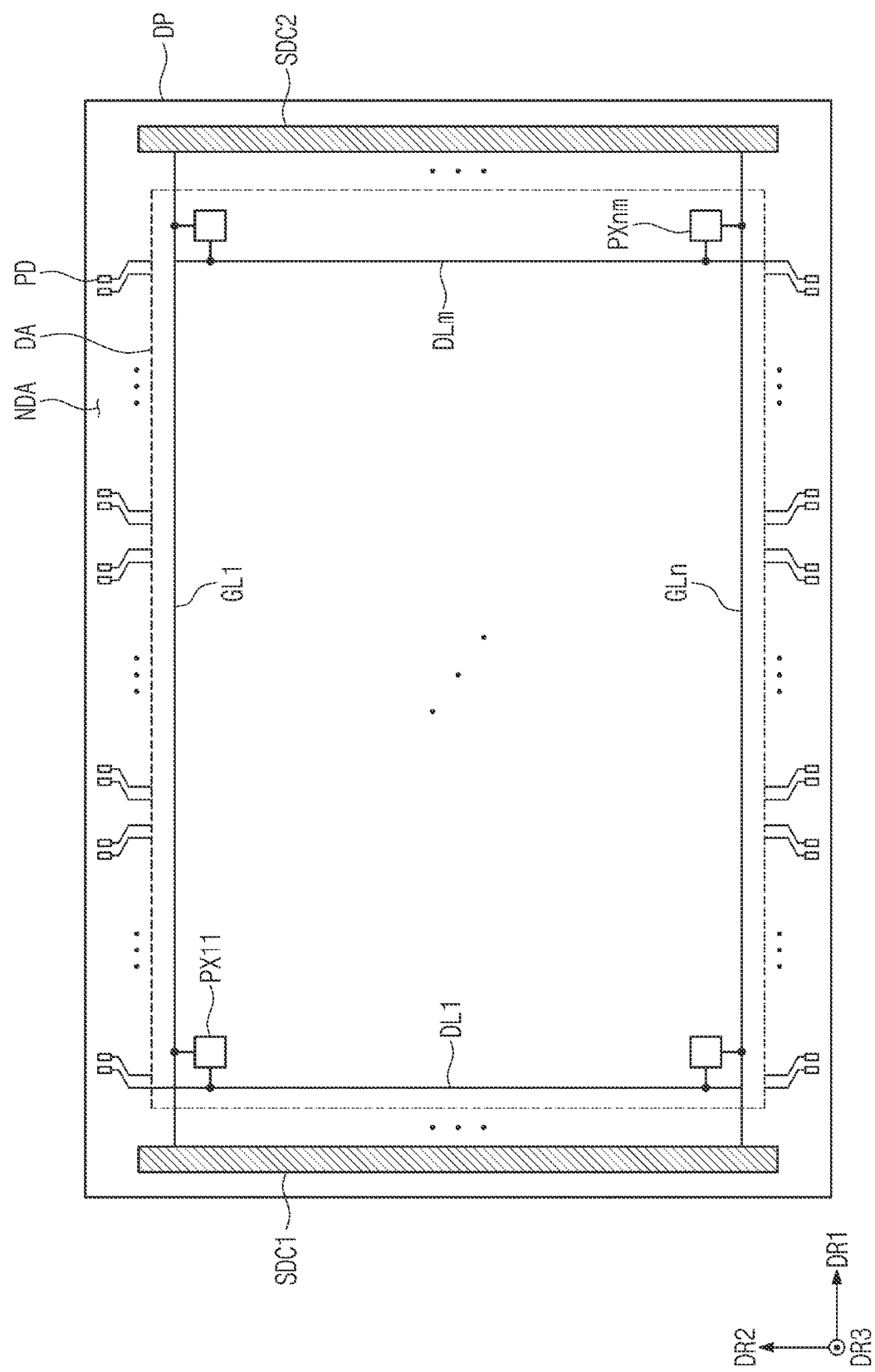

FIGS. 3A and 3B are plan views schematically illustrating a display panel according to an embodiment of the inventive concept. FIGS. 3A and 3B each illustrates the display panel without explicitly depicting all the components. Hereinafter, an embodiment of the inventive concept will be described with reference to FIGS. 3A and 3B. Referring to FIG. 3A, a display panel DP according to an embodiment may be divided into a display region DA and a peripheral region NDA (or non-display region). The display region DA may include a plurality of emitting parts EP.

Each of the emitting parts EP may be a region in which light is emitted by each of the pixels PXij (see FIG. 1). Specifically, each of the emitting parts EP may correspond to an emission opening portion OP-PDL to be described later.

The peripheral region NDA may be disposed to be adjacent to the display region DA. In this embodiment, the peripheral region NDA has a shape surrounding the display region DA. However, this is illustrated as an example. The peripheral region NDA may be disposed at one side of the display region DA or omitted, and is not limited to any one embodiment.

In this embodiment, a scan driver SDC and a data driver DDC may be mounted in the display panel DP. In an embodiment, the scan driver SDC may be disposed in the display region DA, and the data driver DDC may be disposed in the peripheral region NDA. The scan driver SDC may overlap at least some of the plurality of emitting parts EP disposed in the display region DA. As the scan driver SDC is disposed in the display region DA, when compared to a display panel according to the related art in which a scan driver is disposed in a peripheral region, the area of the peripheral region NDA may be reduced, and a display device having a slim bezel may be easily achieved.

Meanwhile, unlike that illustrated in FIG. 3A, the scan driver SDC may be provided in two parts separated from each other. The two scan drivers SDC may be disposed to be spaced apart from each other with a center of the display region DA therebetween in a left and right direction. Alternatively, the scan driver SDC may be provided in two or more, and is not limited to any one embodiment.

Meanwhile, FIG. 3A illustrates an example of the display panel, and the data driver DDC may be disposed in the display region DA. Here, some of the emitting parts EP disposed in the display region DA may overlap the data driver DDC on a plan view.

In an embodiment, the data driver DDC may be provided in the form of a separate driving chip independent of the display panel DP, and connected to the display panel DP. However, this is illustrated as an example. The data driver DDC may be formed in the same process as the scan driver SDC so as to configure the display panel DP, and is not limited to any one embodiment.

As illustrated in FIG. 3B, the display panel DP may have a shape in which a length in the first direction DR1 is greater than a length in the second direction DR2. As exemplarily illustrated, the scan drivers SDC1 and SDC2 include a first scan driver SDC1 and a second scan driver SDC2 that are disposed to be spaced apart from each other in the first direction DR1.

The first scan driver SDC1 may be connected to some of scan lines GL1 to GLn, and the second scan driver SDC2 may be connected to the others of the scan lines GL1 to GLn. For example, the first scan driver SDC1 may be connected to odd-numbered scan lines of the scan lines GL1 to GLn, and the second scan driver SDC2 may be connected to even-numbered scan lines of the scan lines GL1 to GLn.

For ease of explanation, FIG. 3B illustrates pads PD of data lines DL1 to DLm. The pads PD may be defined at ends of the data lines DL1 to DLm. The data lines DL1 to DLm may be connected to the data driver DDC (see FIG. 3A) through the pads PD. FIG. 3B also illustrates pixels PX11 to PXnm.

According to the present disclosure, the pads PD may be separated from one another and arranged in the peripheral region NDA, which are spaced apart from each other with the display region DA therebetween. For example, some of the pads PD may be disposed on a side adjacent to the first scan line GL1 of the scan lines GL1 to GLn, and the others of the pads PD may be disposed on a side adjacent to the last scan line GLn of the scan lines GL1 to GLn. In this embodiment, the pads PD connected to odd-numbered data lines of the data lines DL1 to DLm may be disposed at the upper side, and the pads PD connected to even-numbered data lines of the data lines DL1 to DLm may be disposed at the lower side.

Although not illustrated, the display panel DP may include a plurality of upper data drivers connected to the pads PD disposed at the upper side, and a plurality of lower data drivers connected to the pads PD disposed at the lower side. However, this is described as an example, and the display panel DP may include one upper data driver connected to the pads PD disposed at the upper side, and/or one lower data driver connected to the pads PD disposed at the lower side. That is, the pads PD according to an embodiment of the inventive concept may be disposed only at one side of the display panel DP and connected to a single data driver, and is not limited to any one embodiment.

As described with reference to FIG. 3A, also in the display panel DP in FIG. 3B, the scan driver and/or the data driver may be disposed in the display region DA and accordingly, some of the emitting parts disposed in the display panel DP may overlap the scan driver and/or the data driver on a plan view.

Figure 4A:
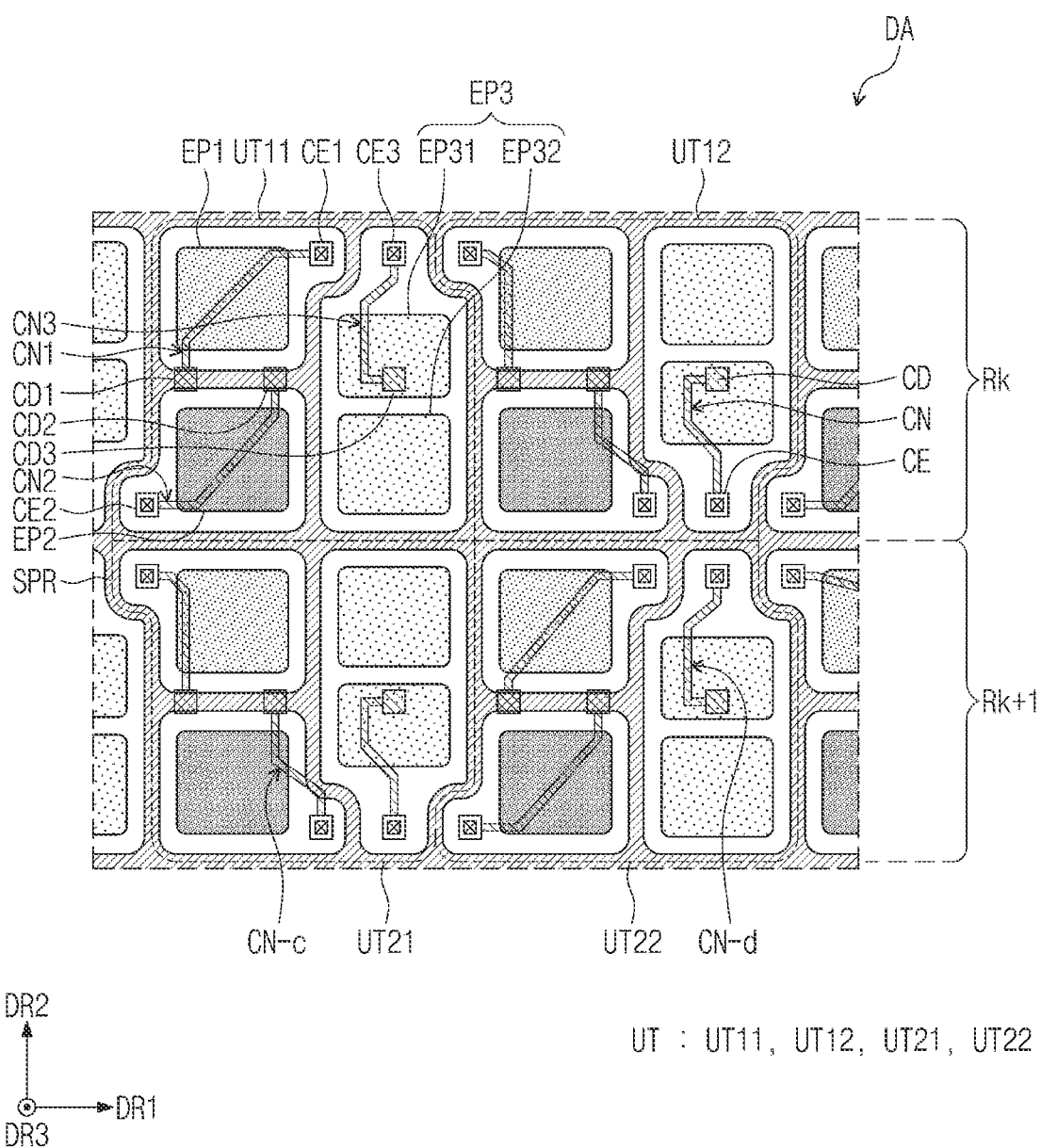
FIGS. 4A to 4C are enlarged plan views of a partial region of a display panel according to an embodiment.
Figure 4B:
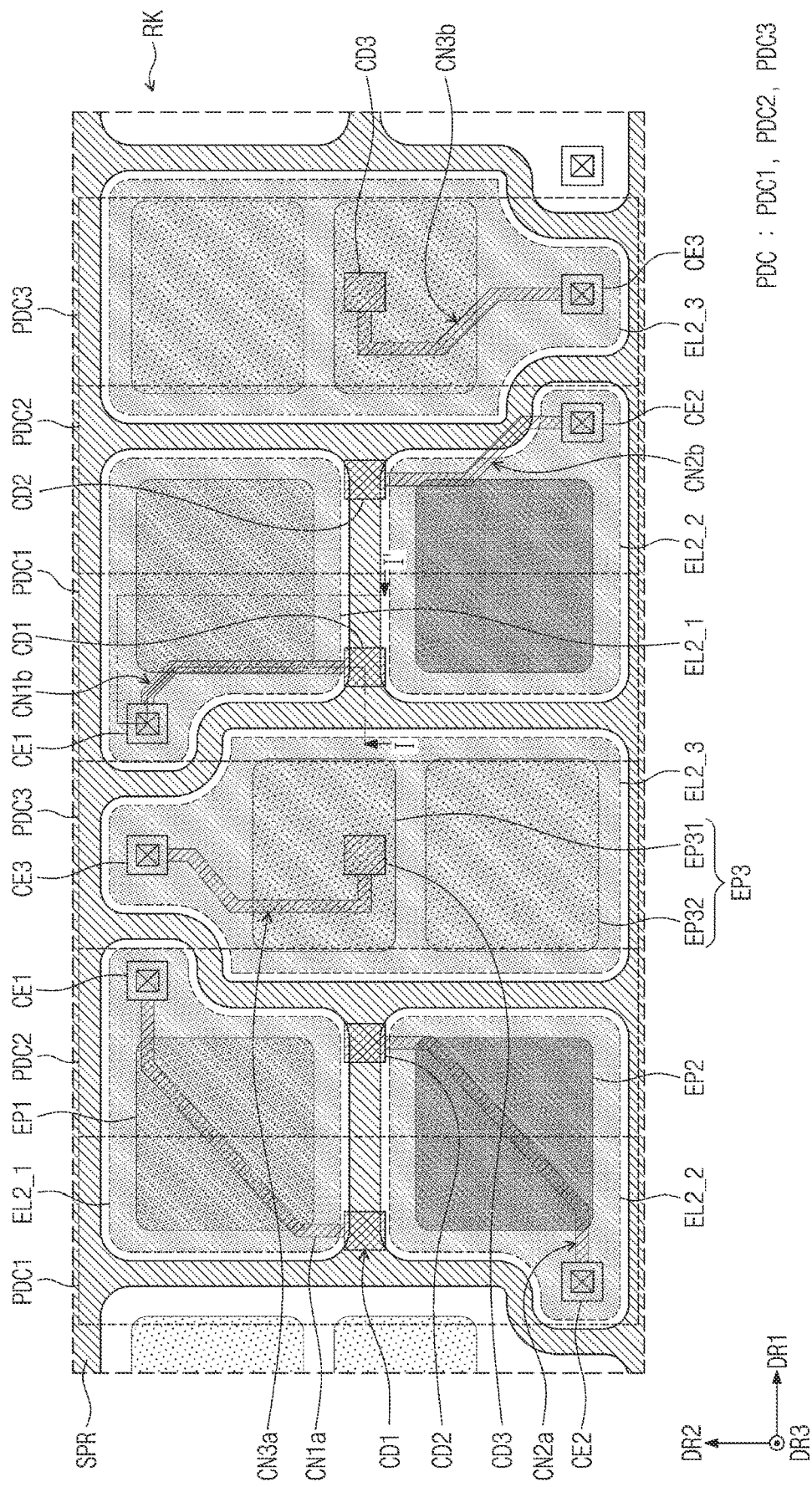
Figure 4C:
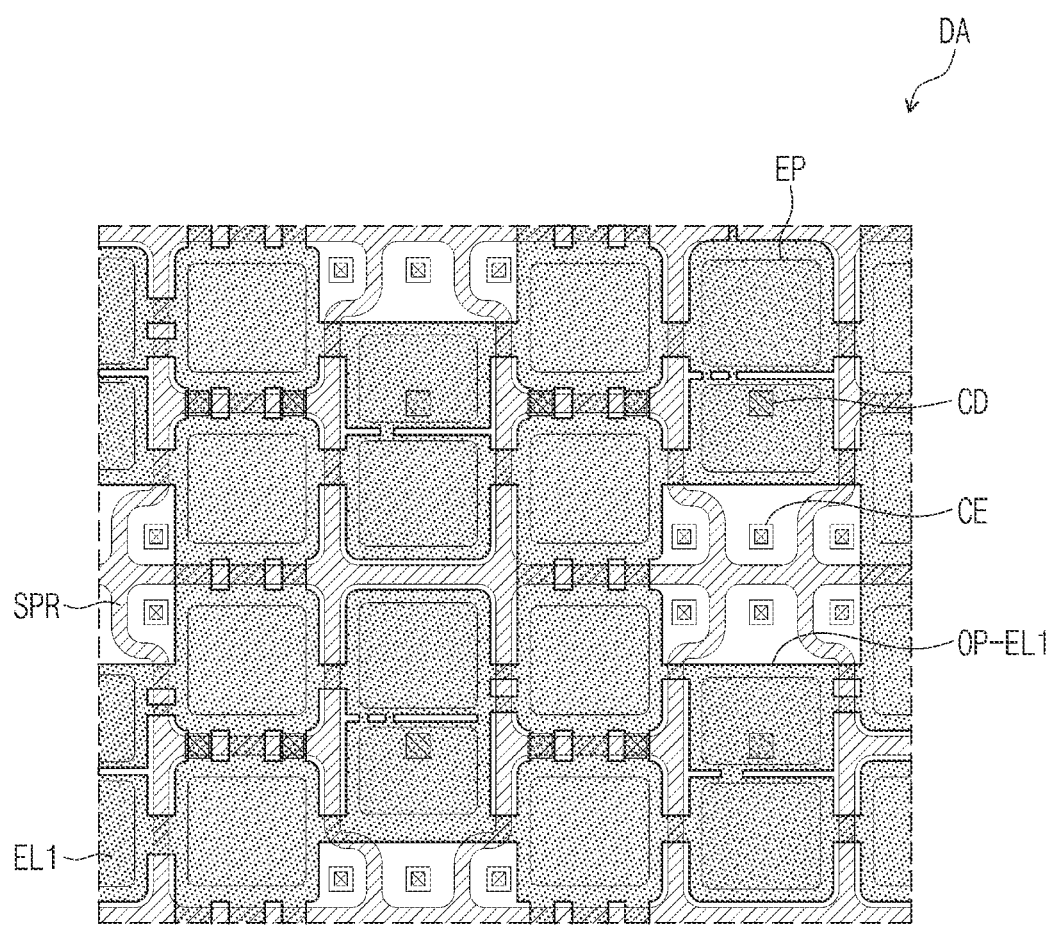

FIGS. 4A to 4C are enlarged plan views of a partial region of a display panel DP (see FIG. 3B) according to an embodiment. FIG. 4A illustrates a region in which four light emitting units UT in total that are arranged in a matrix shape of 2 rows and 2 columns are disposed, and FIG. 4B illustrates an enlarged view of a partial region illustrated in FIG. 4A. FIG. 4C illustrates a view in which some of the components illustrated in FIG. 4A are omitted or highlighted. Hereinafter, an embodiment of the inventive concept will be described with reference to FIGS. 4A to 4C.

FIG. 4A illustrates light emitting units UT11, UT12, UT21 and UT22 arranged in a matrix shape of 2 rows and 2 columns. Emitting parts in a first row Rk may include emitting parts, which are included an light emitting unit UT11 in the first row and the first column and an light emitting unit UT12 in the first row and the second column, and emitting parts in a second row Rk+1 may include emitting parts, which are included in an light emitting unit UT21 in the second row and the first column and an light emitting unit UT22 in the second row and the second column. FIG. 4B illustrates the emitting parts in the first row Rk. FIGS. 4A to 4C illustrate a separator SPR, a plurality of emitting parts EP1, EP2 and EP3, each of which is disposed in a region divided by the separator SPR, connection wirings CN1, CN2 and CN3, a first electrode EL1, second electrodes EL2_1, EL2_2 and EL2_3 among components of the display panel. The plurality of emitting parts EP1, EP2 and EP3 illustrated in FIGS. 4A to 4C are some of the plurality of emitting parts EP illustrated in FIG. 3A.

As described above, each of the emitting parts EP1, EP2 and EP3 may correspond to an emission opening portion OP-PDL (see FIG. 5) to be described later. That is, each of the emitting parts EP1, EP2 and EP3 may be a region, in which light is emitted by the light emitting device described above, and may correspond to a unit that constructs an image displayed in the display panel DP. More specifically, each of the emitting parts EP1, EP2 and EP3 may correspond to a region defined by the emission opening portion OP-PDL (see FIG. 5) to be described later, particularly to a region defined by a bottom surface of the emission opening portion OP-PDL.

The emitting parts EP1, EP2 and EP3 may include a first emitting part EP1, a second emitting part EP2, and a third emitting part EP3. The first emitting part EP1, the second emitting part EP2, and the third emitting part EP3 may emit light having different colors. For example, the first emitting part EP1 may emit red light, the second emitting part EP2 may emit green light, and the third emitting part EP3 may emit blue light, but a color combination is not limited thereto. Alternatively, at least two of the emitting parts EP1, EP2 and EP3 may emit light having the same color.

For example, all of the emitting parts EP1, EP2 and EP3 may emit blue light or emit white light. The third emitting part EP3 of the emitting parts EP1, EP2 and EP3, which emits the light emitted by a third light emitting device, may include sub-emitting parts EP31 and EP32 that are spaced apart from each other in the second direction DR2. However, this is illustrated as an example. The third emitting part EP3 may be provided as one pattern having a shape of one body like the other emitting parts EP2 and EP3, and at least one of the other emitting parts EP2 and EP3 may include sub-emitting parts spaced apart from each other. An embodiment of the inventive concept is not limited to any one embodiment.

The emitting parts in the first row Rk may include the emitting parts EP1, EP2 and EP3, which are included in the light emitting unit UT11 in the first row and the first column and the light emitting unit UT12 in the first row and the second column, and the emitting parts in the second row Rk+1 may include the emitting parts EP1, EP2 and EP3, which are included in the light emitting unit UT21 in the second row and the first column and the light emitting unit UT22 in the second row and the second column. Some of the emitting parts in the first row Rk and some of the emitting parts in the second row Rk+1 may have a symmetrical shape. For example, the first emitting part EP1 and the second emitting part EP2 of the light emitting unit UT21 in the second row and the first column, and the first emitting part EP1 and the second emitting part EP2 of the light emitting unit UT11 in the first row and the first column, may have a shape and arrangement that are symmetric with respect to an axis parallel to the first direction DR1. The third emitting part EP3 of the light emitting unit UT21 in the second row and the first column, and the third emitting part EP3 of the light emitting unit UT11 in the first row and the first column, may have a shape and arrangement that are symmetric with respect to an axis parallel to the first direction DR1. However, this is an example, and an embodiment of the inventive concept is not limited thereto.

Hereinafter, the light emitting unit UT11 in the first row and the first column will be described. For ease of explanation, FIG. 4B illustrates a plurality of second electrodes EL2_1, EL2_2 and EL2_3, a plurality of pixel drivers PDC, and a plurality of connection wirings CN. The second electrodes EL2_1, EL2_2 and EL2_3 may be separated from each other by a separator SPR and electrically disconnected. In this embodiment, one light emitting unit UT may include three emitting parts EP1, EP2 and EP3. Accordingly, the light emitting unit UT may include three second electrodes EL2_1, EL2_2 and EL2_3 (hereinafter referred to as first to three cathodes), three pixel drivers PDC1, PDC2 and PDC3, and three connection wirings CN1, CN2 and CN3. However, this is illustrated as an example, and the number and arrangement of the light emitting unit UT may be varied without being limited to any one embodiment.

The first to three pixel drivers PDC1, PDC2 and PDC3 are electrically connected to light emitting devices that are included in first to three emitting parts EP1, EP2 and EP3, respectively. The term "being connected" used herein includes not only being connected by direct physical contact but also being connected electrically.

A region in which each of the pixel drivers PDC1, PDC2 and PDC3 is defined on a plan view as in FIG. 4B may correspond to a unit in which transistor and capacitor elements that are included in the pixel drivers PDC (see FIG. 2A) for driving a light emitting device of a pixel are repeatedly arranged.

The pixel drivers PDC1, PDC2 may be sequentially disposed in the first direction DR1. The position at which each of the pixel drivers PDC1, PDC2 and PDC3 is disposed may be independently determined irrespective of the position or shape of each of the first, second, and third emitting parts EP1, EP2 and EP3.

For example, the pixel drivers PDC1, PDC2 and PDC3 may be disposed at positions that are different from the regions divided and defined by the separator, i.e., positions at which the cathodes EL2_1, EL2_2 and EL2_3 are disposed, respectively. Additionally, the pixel drivers PDC1, PDC2 and PDC3 may have shapes different from the shapes of each of the cathodes EL2_1, EL2_2 and EL2_3. Alternatively, the pixel drivers PDC1, PDC2 and PDC3 may be disposed to overlap the positions at which the first to third emitting parts EP1, EP2 and EP3 are present, respectively, and to have shapes similar to shapes of the regions divided and defined by the separator, for example, the shapes of the cathodes EL2_1, EL2_2 and EL2_3, respectively.

In this embodiment, as illustrated, each of the first, second, and third pixel drivers PDC1, PDC2 and PDC3 has a rectangular shape, each of the first, second, and third emitting parts EP1, EP2 and EP3 has a smaller area than and arranged in a different shape from each of the pixel drivers PDC1, PDC2, PDC3. In the particular embodiment, the first, second, and third cathodes EL2_1, EL2_2 and EL2_3 are disposed at positions overlapping the first, second, and third emitting parts EP1, EP2 and EP3 and have irregular shapes, respectively.

Accordingly, as illustrated in FIG. 4B, the first pixel driver PDC1 may be disposed at a position partially overlapping each of the first emitting part EP1, the second emitting part EP2, and another adjacent light emitting unit. The second pixel driver PDC2 may be disposed at a position overlapping each of the first emitting part EP1, the second emitting part EP2, and the third emitting part EP3. The third pixel driver PDC3 may be disposed at a position overlapping the third emitting part EP3. However, this is illustrated as an example, each of the first, second, and third pixel drivers PDC1, PDC2 and PDC3 may have various shapes and arrangements independently of the emitting parts EP1, EP2 and EP3, and is not limited to any one embodiment.

The connection wirings CN may be provided in plurality to be disposed apart from each other. Each of the connection wirings CN may electrically connect the pixel driver and the light emitting device to each other. Specifically, the connection wiring CN may correspond to the node (see N4 in FIG. 2A or N2 in FIG. 2B) through which the light emitting device LD is connected to the pixel driver PDC.

The connection wiring CN may include a first connection part CE (or emission connection part) and a second connection part CD (or driver connection part). The emission connection part CE may be provided at one side of the connection wiring CN, and the driver connection part CD may be provided at the other side of the connection wiring CN.

The driver connection part CD may be a portion of the connection wiring CN, which is connected to the pixel driver PDC. In this embodiment, the driver connection part CD may be connected to one electrode of a transistor included in the pixel driver PDC. Specifically, the driver connection part CD may be connected to a drain of the sixth transistor T6 illustrated in FIG. 2A or a drain of the first transistor T1 illustrated in FIG. 2B. Accordingly, a position of the driver connection part CD may correspond to a position of the transistor (see TR in FIG. 5) of the pixel driver, which is physically connected to the connection wiring CN. The emission connection part CE may be a portion of the connection wiring CN, which is connected to the light emitting device. In this embodiment, the emission connection part CE may be connected to the second electrode EL2 (hereinafter referred to as the cathode) of the light emitting device.

The light emitting unit UT may include first to third connection wirings CN1, CN2 and CN3 (shown in FIG. 4A). The first connection wiring CN1 may connect the light emitting device and the first pixel driver PDC1, which form the first emitting part EP1, to each other, the second connection wiring CN2 may connect the light emitting device and the second pixel driver PDC2, which form the second emitting part EP2, to each other, and the third connection wiring CN3 may connect the light emitting device and the third pixel driver PDC3, which form the third emitting part EP3, to each other.

Specifically, the first, second, and third connection wirings CN1, CN2 and CN3 may connect the first to three cathodes EL2_1, EL2_2 and EL2_3 to the first, second, and third pixel drivers PDC1, PDC2 and PDC3, respectively. The first connection wiring CN1 may include a first driver connection part CD1 connected to the first pixel driver PDC1, and a first emission connection part CE1 connected to the first cathode EL2_1. The second connection wiring CN2 may include a second driver connection part CD2 connected to the second pixel driver PDC2, and a second emission connection part CE2 connected to the second cathode EL2_2. The first connection wiring CN3 may include a third driver connection part CD3 connected to the third pixel driver PDC3, and a third emission connection part CE3 connected to the third cathode EL2_3.

The first to third driver connection parts CD1, CD2 and CD3 may be arranged in the first direction DR1, as shown in FIG. 4B. As described above, the first to third driver connection parts CD1, CD2 and CD3 may correspond to positions of connection transistors that constitute the first to three pixel drivers PDC1, PDC2 and PDC3, respectively. Each of the connection transistors may be a transistor that includes, as one electrode, a connection node through which the pixel driver and the light emitting device are connected to each other in one pixel. For example, the connection transistor may correspond to the sixth transistor T6 in FIG. 2A or the first transistor T1 in FIG. 2B. According to an embodiment of the inventive concept, the pixel driver shape or position and arrangement of all the pixels may be simply configured and designed irrespective of the shape, size, emission color of the emitting part.

In this embodiment, the first to third emission connection parts CE1, CE2 and CE3 may be arranged at positions non-overlapping the emitting parts EP1, EP2 and EP3 on a plan view. As described later, the emission connection part CE (see FIG. 5) of the connection wiring CN is a portion to which a light emitting device LD (see FIG. 5) is connected and a portion at which a tip part TP (see FIG. 5) is defined, and thus, may be provided at a position non-overlapping the emission opening portion OP-PDL. That is, the emission connection parts CE1, CE2 and CE3 may be disposed at positions spaced apart from the emitting parts EP1, EP2 and EP3 in the cathodes EL2_1, EL2_2 and EL2_3, respectively, and the cathodes EL2_1, EL2_2 and EL2_3 may include some regions protruding from the emitting parts EP1, EP2 and EP3 in order to be connected to the connection wirings CN1, CN2 and CN3 at the positions at which the emission connection parts CE1, CE2 and CE3 are disposed, respectively, on a plan view.

For example, the first cathode EL2_1 may include a protrusion having a shape protruding from the first emitting part EP1 at the position non-overlapping the first emitting part EP1 in order to be connected to the first connection wiring CN1 at the position at which the first emission connection part CE1 is disposed. The emission connection part CE1 may be provided at the protrusion.

The first pixel driver PDC1, particularly the first driver connection part CD1 that is a position at which the first connection wiring CN1 is connected to a transistor TR, may be defined at a position non-overlapping the first emitting part EP1 on a plan view. According to an embodiment of the inventive concept, as the first connection wiring CN1 is disposed in the first emitting part EP1, the first cathode EL2_1 and the first pixel driver PDC1 that are spaced apart from each other may be easily connected to each other.

The third pixel driver PDC3, particularly the third driver connection part CD3 that is a position at which the third connection wiring CN3 is connected to the transistor TR, may be defined at a position non-overlapping the third emission connection part CE3 and disposed at a position non-overlapping the third emitting part EP3 on a plan view. According to an embodiment of the inventive concept, as the third cathode EL2_3 and the third pixel driver PDC3 are connected to each other through the third connection wiring CN3, limitations on the position or shape of the third emitting part EP3 may be reduced in the aspects of designing the third pixel driver PDC3 and thus, a degree of freedom in design may be improved.

Referring to FIG. 4A again, the emitting parts in the second row Rk+1 may be constituted by emitting parts having a shape and arrangement in which the light emitting units UT11 and UT12 in the first row are symmetric with respect to the axis parallel to the first direction DR1 or the second direction DR2. Here, due to the characteristics in aspects of the shapes and arrangement of the light emitting units UT11 and UT12 in the first row, the light emitting units UT21 and UT22 in the second row may be constituted by emitting parts having a configuration which the light emitting units UT11 and UT12 in the first row are shifted in first direction DR1 or the second direction DR2. That is, the light emitting unit UT21 in the second row and the first column may be constituted by emitting parts having the same shapes as those of the light emitting unit UT12 in the first row and the second column, and the light emitting unit UT22 in the second row and the second column may be constituted by emitting parts having the same shapes as those of the light emitting unit UT11 in the first row and the first column.

Accordingly, connection wirings CN-c disposed in the light emitting unit UT21 in the second row and the first column may have the same shapes and arrangement as connection wirings CN1$b$, CN2$b$ and CN3$b$ disposed in the light emitting unit UT12 in the first row and the second column. Likewise, connection wirings CN-d disposed in the light emitting unit UT22 in the second row and the second column may have the same shapes and arrangement shapes as connection wirings CN1$a$, CN2$a$ and CN3$a$ disposed in the light emitting unit UT11 in the first row and the first column.

Meanwhile, referring to FIG. 4C, a first electrode EL1 (hereinafter referred to as anode) of a light emitting device according to an embodiment of the inventive concept may be provided, in common, in a plurality of emitting parts EP1, EP2 and EP3. That is, the anode EL1 may be formed as one layer, which is one body, entirely in a display region DA and accordingly, an anode EL1 layer may be disposed to overlap a separator SPR. Alternatively, a plurality of anodes EL1, each of which is provided in the light emitting device, may be formed as independent conductive patterns spaced apart from each other, and electrically connected to each other through another conductive pattern. Accordingly, anodes EL1 patterns may be disposed not to overlap separator SPR.

As described above, a first power supply voltage VDD may be applied to the anode EL1, and common voltage may be supplied to all of the emitting parts. The anode EL1 may be connected to the first power line VDL (see FIG. 2A), which supplies the first power supply voltage VDD, in a peripheral region NDA or may be connected to the first power line VDL in the display region DA, and is not limited to any one embodiment.

A plurality of opening portions may be defined in the anode EL1 according to this embodiment, and the opening portions may pass through the anode EL1 layer. Each of the opening portions of the anode EL1 layer may be disposed at a position non-overlapping each of the emitting parts EP, and generally, may be defined at a position overlapping the separator SPR. The opening portions may facilitate discharge of gas generated from an organic layer, for example, a sixth insulation layer 60 (see FIG. 5) to be described later, which is disposed below the opening portions. Accordingly, the gas of the organic layer disposed below the light emitting device may be sufficiently discharged during manufacture of a display panel, and the gas discharged from the organic layer may be reduced after the manufacture, thereby reducing the rate of degradation of the light emitting device.

According to the present disclosure, as the connection wiring is included between the light emitting device and the pixel driver, the light emitting device may be easily connected to the pixel driver by changes only in cathode shape even without changes in arrangement or shape of the emitting parts. Accordingly, the degree of freedom in design of the arrangement of the pixel driver may be improved, and the area or resolution of the emitting part of the display panel may be easily increased.

Figure 5:
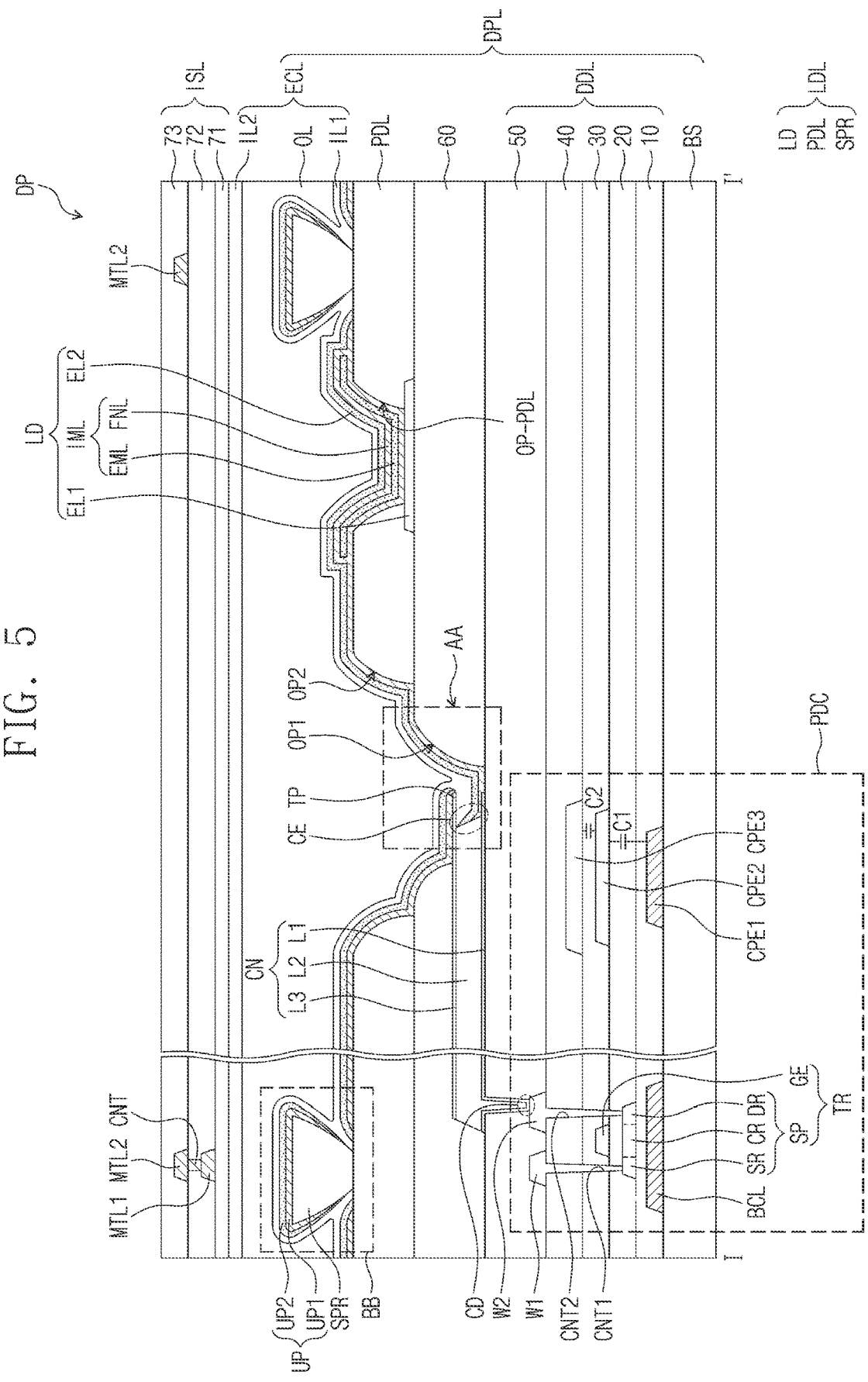
FIG. 5 is a cross-sectional view of a display panel taken along cutting plane line I-I' in FIG. 4B.
Figure 6A:
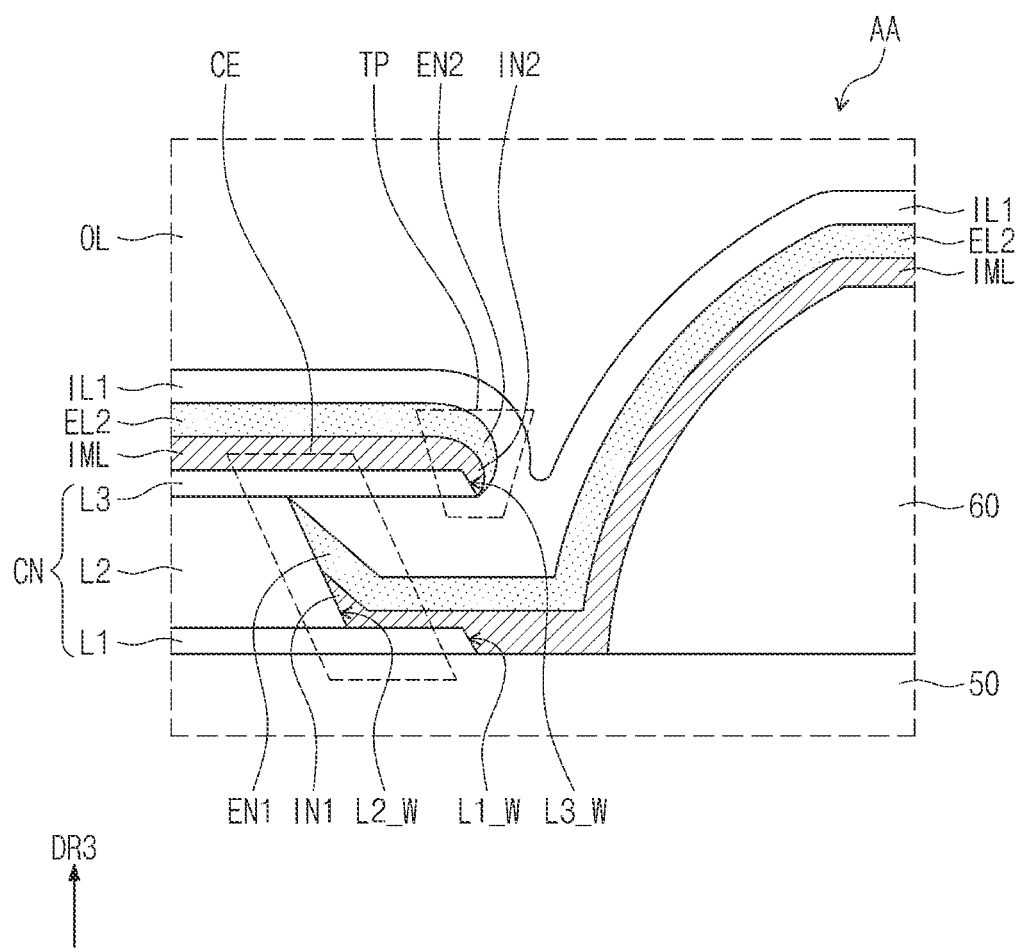
FIGS. 6A and 6B are enlarged cross-sectional views of a partial region of a display panel according to an embodiment.
Figure 6B:
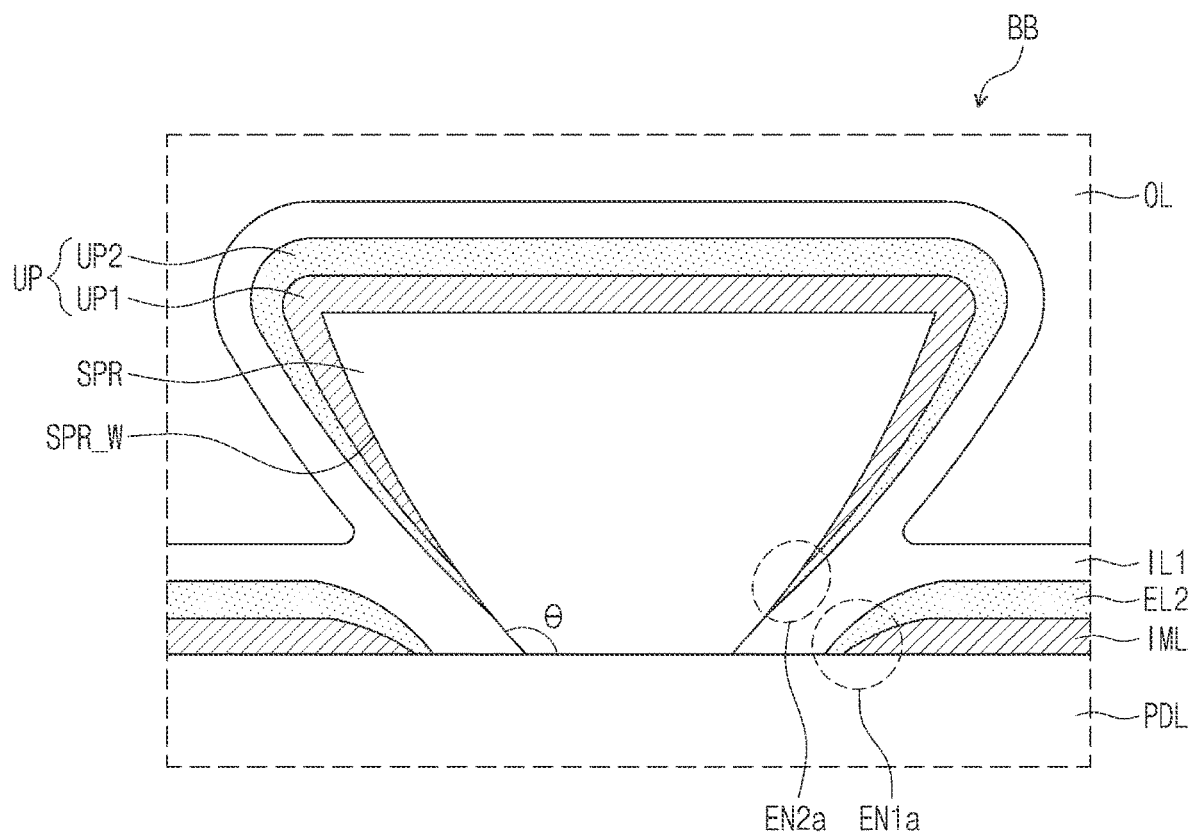

FIG. 5 is a cross-sectional view of a display panel according to an embodiment of the inventive concept. FIG. 6A is an enlarged cross-sectional view of a partial region of a display panel according to an embodiment. FIG. 6B is an enlarged cross-sectional view of a partial region of a display panel according to an embodiment. FIG. 5 illustrates a cross-sectional view of a portion corresponding to line I-I' in FIG. 4B. FIG. 6A illustrates an enlarged cross-sectional view of area AA in FIG. 5, and FIG. 6B illustrates an enlarged cross-sectional view of area BB in FIG. 5. Hereinafter, an embodiment of the inventive concept will be described with reference to FIGS. 5 and 6B.

Referring to FIG. 5, a display panel DP according to an embodiment may include a display layer DPL, which displays an image, and a sensing layer ISL disposed on the display layer DPL. The display layer DPL may include a base layer BS, a driving device layer DDL, a light emitting device layer LDL, and an encapsulation layer ECL. The driving device layer DDL may include a plurality of insulation layers 10, 20, 30, 40 and 50 disposed on the base layer BS, and a plurality of conductive patterns and semiconductor patterns disposed between the insulation layers 10, 20, 30, 40 and 50. The conductive patterns and semiconductor patterns may be disposed between the insulation layers and constitute a pixel driver PDC. For ease of explanation, FIG. 5 illustrates a cross section of any one region in which one emitting part is disposed.

The base layer BS may be a flexible substrate capable of bending, folding, rolling, etc. The base layer BS may be a glass substrate, a metal substrate, a polymer substrate or the like. The base layer BS may be a rigid substrate or may be a flexible substrate that is bendable, foldable, or rollable. However, an embodiment of the inventive concept is not limited thereto, and the base layer BS may be an inorganic layer, an organic layer, or a composite material layer.

The base layer BS may have a multilayer structure. The base layer BS may include a first polymer resin layer, a silicon oxide (SiOx) layer disposed on the first polymer resin layer, an amorphous silicon (a-Si) layer disposed on the silicon oxide layer, and a second polymer resin layer disposed on the amorphous silicon layer. Each of the silicon oxide layer and the amorphous silicon layer may be referred to as a base barrier layer.

The polymer resin layer may include a polyimide-based resin. In addition, the polymer resin layer may include at least one of an acrylate-based resin, a methacrylate-based resin, a polyisoprene-based resin, a vinyl-based resin, an epoxy-based resin, an urethane-based resin, a cellulose-based resin, a siloxane-based resin, a polyamide-based resin, and a perylene-based resin. In the present disclosure, the "~~ based" resin means including a functional group of "~~".

Each of the insulation layers, conductive layers, and semiconductor layers, which are disposed on the base layer BS, may be formed through coating, deposition and the like. Thereafter, the insulation layer, the semiconductor layer, and the conductive layer may be selectively patterned by performing a photolithography process multiple times and thus, a hole may be defined in the insulation layer or the semiconductor pattern, the conductive pattern, a signal line and the like, may be formed.

The driving device layer DDL may include first, second, third, fourth, and fifth insulation layers 10, 20, 30, 40 and 50 and the pixel driver PDC, which are sequentially stacked on the base layer BS. FIG. 5 illustrates one transistor TR and two capacitors C1 and C2 in the pixel driver PDC. The transistor TR may correspond to a transistor connected to a light emitting device LD through a connection wiring CN, i.e., a connection transistor connected to a node (the fourth node N4 in FIG. 2A or the second node N2 in FIG. 2B) corresponding to a cathode of the light emitting device LD. Specifically, transistor TR may correspond to the sixth transistor T6 in FIG. 2A or the first transistor T1 in FIG. 2B. Although not illustrated, the other transistors that constitute the pixel driver PDC may each have the same structure as the transistor TR (hereinafter referred to as the connection transistor) illustrated in FIG. 5. However, this is described as an example. The other transistors that constitute the pixel driver PDC may each have a different structure from the connection transistor TR, and is not limited to any one embodiment.

The first insulation layer 10 may be disposed on the base layer BS. The first insulation layer 10 may be an inorganic layer and/or an organic layer, and have a single-layer or multilayer structure. The first insulation layer 10 may include at least one of an aluminum oxide, a titanium oxide, a silicon oxide, a silicon nitride, a silicon oxynitride, a zirconium oxide, and a hafnium oxide. In this embodiment, a single-layered silicon oxide layer may be illustrated as the first insulation layer 10. Each of insulation layers to be described later may be an inorganic layer and/or an organic layer, and have a single-layer or multilayer structure. The inorganic layer may include at least one of the foregoing materials, but is not limited thereto.

The first insulation layer 10 may cover a bottom conductive layer BCL. That is, the display panel may further include the bottom conductive layer BCL disposed to overlap the connection transistor TR. The bottom conductive layer BCL may block an electrical potential caused by a polarization phenomenon of the base layer BS from affecting the connection transistor TR. The bottom conductive layer BCL may block light incident from a lower side into the connection transistor TR. At least one of an inorganic barrier layer and a buffer layer may be further disposed between the bottom conductive layer BCL and the base layer BS.

The bottom conductive layer BCL may include a reflective metal. For example, the bottom conductive layer BCL may include titanium (Ti), molybdenum (Mo), a molybdenum-containing alloy, aluminum (Al), an aluminum-containing alloy, aluminum nitride (AlN), tungsten (W), tungsten nitride (WN), copper (Cu), and the like.

In this embodiment, the bottom conductive layer BCL may be connected to a source of the transistor TR through a source electrode pattern W1. In this case, the bottom conductive layer BCL may be synchronized with the source of the transistor TR. However, this is illustrated as an example, and the bottom conductive layer BCL may be connected to a gate of the transistor TR and synchronized with the gate. Alternatively, the bottom conductive layer BCL may be connected to another electrode and independently receive a constant voltage or a pulse signal. Alternatively, the bottom conductive layer BCL may be provide in a shape isolated from another conductive pattern. The bottom conductive layer BCL according to an embodiment of the inventive concept may be provided in various shapes, and is not limited to any one embodiment.

The connection transistor TR may be disposed on the first insulation layer 10. The connection transistor TR may include a semiconductor pattern SP and a gate electrode GE. The semiconductor pattern SP may be disposed on the first insulation layer 10. The semiconductor pattern SP may include an oxide semiconductor. For example, the semiconductor pattern SP may include a transparent conductive oxide (TCO) such as indium tin oxide (ITO), indium zinc oxide (IZO), indium gallium zinc oxide (IGZO), zinc oxide (ZnO) or indium oxide ($In_2O_3$). However, an embodiment of the inventive concept is not limited thereto, and the semiconductor pattern SP may include amorphous silicon, low-temperature polycrystalline silicon, or polycrystalline silicon.

The semiconductor pattern SP may include a source region SR, a drain region DR, and a channel region CR that are distinguished by the extent of conductivity. The channel region CR may be a portion that overlaps the gate electrode GE on a plan view. The source region SR and the drain region DR may be portions that are be spaced apart from each other with the channel region CR therebetween. When the semiconductor pattern SP is an oxide semiconductor, the source region SR and the drain region DR may each be a reduced region. Accordingly, the source region SR and the drain region DR may each have a relatively higher reducible metal content than the channel region CR. When the semiconductor pattern SP is polycrystalline silicon, the source region SR and the drain region DR may each be a more heavily doped region.

The source region SR and the drain region DR may each have relatively higher conductivity than the channel region CR. The source region SR may correspond to a source electrode of the connection transistor TR, and the drain region DR may correspond to a drain electrode of the connection transistor TR. As illustrated in FIG. 5, a separate source electrode pattern W1 and drain electrode pattern W2 that are connected to the source region SR and the drain region DR, respectively, may be further provided. Specifically, each of the separate source electrode pattern W1 and drain electrode pattern W2 may be integrally formed with one of lines that constitute the pixel driver (see FIGS. 2A and 2B), and is not limited to any one embodiment.

The second insulation layer 20 may overlap, in common, a plurality of pixels and cover the semiconductor pattern SP. The second insulation layer 20 may be an inorganic layer and/or an organic layer, and have a single-layer or multilayer structure. The second insulation layer 20 may include at least one of an aluminum oxide, a titanium oxide, a silicon oxide, a silicon nitride, a silicon oxynitride, a zirconium oxide, and a hafnium oxide. In this embodiment, the second insulation layer 20 may be a single-layered silicon oxide layer.

The gate electrode GE may be disposed on the second insulation layer 20. The gate electrode GE may correspond to the gate of the connection transistor TR. The gate electrode GE may be disposed above the semiconductor pattern SP. However, this is illustrated as an example. The gate electrode GE may be disposed below the semiconductor pattern SP, and is not limited to any one embodiment.

The gate electrode GE may include titanium (Ti), silver (Ag), molybdenum (Mo), aluminum (Al), aluminum nitride (AlN), tungsten (W), tungsten nitride (WN), copper (Cu), or an alloy thereof, etc., but is not particularly limited thereto.

The third insulation layer 30 may be disposed on the gate electrode GE. The third insulation layer 30 may be an inorganic layer and/or an organic layer, and have a single-layer or multilayer structure. The third insulation layer 30 may include at least one of an aluminum oxide, a titanium oxide, a silicon oxide, a silicon nitride, a silicon oxynitride, a zirconium oxide, or a hafnium oxide.

Among a plurality of conductive patterns W1, W2, CPE1, CPE2 and CPE3, a first capacitor electrode CPE1 and a second capacitor electrode CPE2 constitute a first capacitor C1. The first capacitor electrode CPE1 and the second capacitor electrode CPE2 may be spaced apart from each other with the first insulation layer 10 and the second insulation layer 20 therebetween.

In this embodiment, the first capacitor electrode CPE1 and the bottom conductive layer BCL may have a shape of one body. The second capacitor electrode CPE2 and the gate electrode GE may have a shape of one body.

A third capacitor electrode CPE3 may be disposed on the third insulation layer 30. The third capacitor electrode CPE3 may be spaced apart from and overlap the second capacitor electrode CPE2 with the third insulation layer 30 therebetween on a plan view. The third capacitor electrode CPE3 and the second capacitor electrode CPE2 may constitute a second capacitor C2.

The fourth insulation layer 40 may be disposed on the third insulation layer 30 and/or the third capacitor electrode CPE3. The fourth insulation layer 40 may be an inorganic layer and/or an organic layer, and have a single-layer or multilayer structure. The fourth insulation layer 40 may include at least one of an aluminum oxide, a titanium oxide, a silicon oxide, a silicon nitride, a silicon oxynitride, a zirconium oxide, and a hafnium oxide.

The source electrode pattern W1 and the drain electrode pattern W2 may be disposed on the fourth insulation layer 40. The source electrode pattern W1 may be connected to the source region SR of the connection transistor TR through a first contact hole CNT1, and the source electrode pattern W1 and the source region SR of the semiconductor pattern SP may function as a source of the connection transistor TR. The drain electrode pattern W2 may be connected to the drain region DR of the connection transistor TR through a second contact hole CNT2, and the drain electrode pattern W2 and the drain region DR of the semiconductor pattern SP may function as a drain of the connection transistor TR. The fifth insulation layer 50 may be disposed on the source electrode pattern W1 and the drain electrode pattern W2.

The connection wiring CN may be disposed on the fifth insulation layer 50. The connection wiring CN may electrically connect the pixel driver PDC and the light emitting device LD to each other. That is, the connection wiring CN may electrically connect the connection transistor TR and the light emitting device to each other. The connection wiring CN may be a connection node through which the pixel driver PDC and the light emitting device LD are connected to each other. That is, the connection wiring CN may correspond to the fourth node N4 (see FIG. 2A) illustrated in FIG. 2A or correspond to the second node N2 (see FIG. 2B) illustrated in FIG. 2B. However, this is described as an example. The connection wiring CN may be defined as a node connected to various elements among elements constituting the pixel driver PDC according to the design of the pixel driver PDC as long as being connected to the light emitting device LD, and is not limited to any one embodiment.

The sixth insulation layer 60 may be disposed on the connection wiring CN. The sixth insulation layer 60 may be disposed on the fifth insulation layer 50 and cover the connection wiring CN. Each of the fifth insulation layer 50 and the sixth insulation layer 60 may be an organic layer. For example, each of the fifth insulation layer 50 and the sixth insulation layer 60 may include benzocyclobutene (BCB), polyimide, hexamethyldisiloxane (HMDSO), polymethylmethacrylate (PMMA), general purpose polymer such as polystyrene (PS), polymer derivative having a phenol-based group, acryl-based polymer, imide-based polymer, acryl ether-based polymer, amide-based polymer, fluorine-based polymer, p-xylene-based polymer, vinyl alcohol-based polymer, or a blend thereof, etc.

An opening portion that exposes at least a portion of the connection wiring CN may be provided in the sixth insulation layer 60. The connection wiring CN may be electrically connected the light emitting device LD through the portion exposed from the sixth insulation layer 60. That is, the connection wiring CN may electrically connect the connection transistor TR and the light emitting device LD to each other. This will be described in detail later. In the display panel DP according to an embodiment of the inventive concept, the sixth insulation layer 60 may be omitted or may be provided in plurality, and is not limited to any one embodiment.

The light emitting device layer LDL may be disposed on the sixth insulation layer 60. The light emitting device layer LDL may include a pixel defining film PDL, the light emitting device LD, and a separator SPR. The pixel defining film PDL may be an organic layer. For example, the pixel defining film PDL may include benzocyclobutene (BCB), polyimide, hexamethyldisiloxane (HMDSO), polymethylmethacrylate (PMMA), general purpose polymer such as polystyrene (PS), polymer derivative having a phenol-based group, acryl-based polymer, imide-based polymer, acryl ether-based polymer, amide-based polymer, fluorine-based polymer, p-xylene-based polymer, vinyl alcohol-based polymer, or a blend thereof, etc.

In this embodiment, the pixel defining film PDL may have a light absorbing property and have, for example, a black color. That is, the pixel defining film PDL may include a black coloring agent. The black coloring agent may include a black dye or a black pigment. The black coloring agent may include a carbon black, a metal such as chrome, or an oxide thereof. The pixel defining film PDL may correspond to a light-shielding pattern having a light-shielding property.

An opening portion OP-PDL (hereinafter referred to as the emission opening portion), which exposes at least a portion of a first electrode EL1 to be described later, may be defined in the pixel defining film PDL. That is, the emission opening portion OP-PDL may overlap a portion of the first electrode EL1. The emission opening portion OP-PDL may be provided in plurality and disposed to correspond to each of the light emitting devices. The emission opening portion OP-PDL may be disposed to correspond to all of components of the light emitting device LD, and may be substantially a region (hereinafter referred to as the emission region) in which light emitted by the light emitting device LD is displayed. Accordingly, a shape of the emitting part EP (see FIG. 2) described above may substantially correspond to a shape of the emission opening portion OP-PDL or an emission region PXA (see FIG. 10) on a plan view.

The light emitting device LD may include a first electrode EL1, an intermediate layer IML, and a second electrode EL2. The first electrode EL1 may be a transflective, transmissive, or reflective electrode. According to an embodiment of the inventive concept, the first electrode EL1 may include a reflective layer, which is formed of silver (Ag), magnesium (Mg), aluminum (Al), platinum (Pt), palladium (Pd), gold (Au), nickel (Ni), neodymium (Nd), iridium (Ir), chrome (Cr), or a compound thereof, etc., or a transmissive or transflective layer disposed on the reflective layer. The transmissive or transflective layer may include at least one selected from the group consisting of an indium tin oxide (ITO), an indium zinc oxide (IZO), an indium gallium zinc oxide (IGZO), a zinc oxide (ZnO) or an indium oxide ($In_2O_3$), and an aluminum-doped zinc oxide (AZO). For example, the first electrode EL1 may include a stacked structure of ITO/Ag/ITO.

In this embodiment, the first electrode EL1 may be an anode of the light emitting device LD. That is, the first electrode EL1 may be connected to the first power line VDL (see FIG. 2A), and the first power supply voltage VDD (see FIG. 2A) may be applied to the first electrode EL1. The first electrode EL1 may be connected to the first power line VDL in the display region DA, or connected to the first power line VDL in the peripheral region NDA. In the latter case, the first power line VDL may be disposed in the peripheral region NDA, and the first electrode EL1 may have a shape extending to the peripheral region NDA.

Although FIG. 5 illustrates the cross-sectional view in which the first electrode EL1 overlaps the emission opening portion OP-PDL and does not overlap the separator SPR, the respective first electrodes EL1 of the light emitting devices may have a shape of one body and a mesh or lattice shape in which opening portions are defined in some regions, as described in detail with reference to FIG. 4C. That is, when the same first power supply voltage VDD may be applied to the first electrodes EL1 of each of the plurality of light emitting devices, the shape of the first electrodes EL1 may be variously provided, and is not limited to any one embodiment.

The intermediate layer IML may be disposed between the first electrode EL1 and the second electrode EL2. The intermediate layer IML may include an emitting layer EML and a functional layer FNL. The light emitting device LD may include the intermediate layer IML having various structures, and is not limited to any one embodiment. For example, the functional layer FNL may be provided as a plurality of layers, or provided as two or more layers that are spaced apart from each other with the emitting layer EML therebetween. Alternatively, the functional layer FNL may be omitted in an embodiment.

The emitting layer EML may include an organic luminescent material. Alternatively, the emitting layer EML may include an inorganic luminescent material or provided as a mixed layer of an organic luminescent material and an inorganic luminescent material. In this embodiment, the respective emitting layers EML included in adjacent emitting parts EP may include luminescent materials that display different colors. For example, the emitting layer EML included in each of the emitting parts EP may provide one of blue, red, and green light. However, an embodiment of the inventive concept is not limited thereto, and the respective emitting layers EML included in the emitting parts EP may have luminescent materials that display the same color. In this case, the emitting layer EML may provide blue light or white light. Although FIG. 5 illustrates an embodiment in which the emitting layer EML and the functional layer FNL have different shapes, an embodiment of the inventive concept is not limited thereto, and the emitting layer EML and the functional layer FNL may be arranged in the same shape on a plan view.

The functional layer FNL may be disposed between the first electrode EL1 and the second electrode EL2. Specifically, the functional layer FNL may be disposed between the first electrode EL1 and the emitting layer EML or disposed between the second electrode EL2 and the emitting layer EML. Alternatively, the functional layer FNL may be disposed both between the first electrode EL1 and the emitting layer EML and between the second electrode EL2 and the emitting layer EML. In this embodiment, the emitting layer EML is illustrated as one inserted into the functional layer FNL. However, this is an example. The functional layer FNL may include a layer disposed between the emitting layer EML and the first electrode EL1, and/or a layer disposed between the emitting layer EML and the second electrode EL2, and each of the layers may be provided in plurality. The functional layer FNL is not limited to any one embodiment.

The functional layer FNL may control movement of charges between the first electrode EL1 and the second electrode EL2. The functional layer FNL may include a hole injection/transport material and/or an electron injection/transport material. The functional layer FNL may include at least one of an electron blocking layer, a hole transport layer, a hole injection layer, a hole blocking layer, an electron transport layer, an electron injection layer, and a charge generation layer.

The second electrode EL2 may be one of the second electrodes EL2_1, EL2_2 and EL2_3 illustrated in FIGS. 4A to 4C. For example, the second electrode EL2 may be the second electrode EL2_1 (see FIG. 4B). The second electrode EL2 may be disposed on the intermediate layer IML. As described above, the second electrode EL2 may be connected to the connection wiring CN and electrically connected to the pixel driver PDC. That is, the second electrode EL2 may be electrically connected to the connection transistor TR through the connection wiring CN.

As described above, the connection wiring CN may include a driver connection part CD and an emission connection part CE. The driver connection part CD may be a portion of the connection wiring CN, which is connected to the pixel driver PDC, and be substantially a portion connected to the connection transistor TR. In this embodiment, the driver connection part CD may pass through the fifth insulation layer 50 and be electrically connected to the drain region DR of the semiconductor pattern SP through the drain electrode pattern W2. The emission connection part CE may be a portion of the connection wiring CN, which is connected to the light emitting device LD. The emission connection part CE may be defined in a region exposed from the sixth insulation layer 60, and be a portion to which the second electrode EL2 is connected. Here, a tip part TP may be defined in the emission connection part CE.

The emission connection part CE of the connection wiring CN will be described in more detail with reference to FIGS. 5 and 6A. As illustrated in FIGS. 5 and 6A, the connection wiring CN may have three-layer structure. Specifically, the connection wiring CN may include a first layer L1, a second layer L2, and a third layer L3 that are sequentially stacked in a third direction DR3. The second layer L2 may include a material different from that of the first layer L1. In addition, the second layer L2 may include a material different from that of the third layer L3. The second layer L2 may have a relatively larger thickness than the first layer L1. In addition, the second layer L2 may have a relatively larger thickness than the third layer L3. The second layer L2 may include a material having high conductivity. In this embodiment, the second layer L2 may include aluminum (Al).

The first layer L1 may include a material having a lower etch rate than the second layer L2. That is, the first layer L1 and the second layer L2 may be made of different materials of which one has higher etch selectivity than the other. In an embodiment, the first layer L1 may include titanium (Ti), and the second layer L2 may include aluminum (Al). In this case, a side surface L1_W of the first layer L1 may be defined outward from a side surface L2_W of the second layer L2. That is, the emission connection part CE of the connection wiring CN may have a shape in which the side surface L1_W of the first layer L1 protrudes outward from the side surface L2_W of the second layer L2. That is, the emission connection part CE of the connection wiring CN may have a shape in which the side surface L2_W of the second layer L2 is recessed inward from the side surface L1_W of the first layer L1.

The third layer L3 may include a material having lower etch selectivity than that of the second layer L2. That is, the third layer L3 and the second layer L2 may be made of materials of which one has higher etch selectivity than the other. In an embodiment, the third layer L3 may include titanium (Ti), and the second layer L2 may include aluminum (Al). In this case, a side surface L3_W of the third layer L3 may be defined outward from the side surface L2_W of the second layer L2. That is, the emission connection part CE of the connection wiring CN may have a shape in which the side surface L3_W of the third layer L3 protrudes outward from the side surface L2_W of the second layer L2. That is, the emission connection part CE of the connection wiring CN may have an undercut shape or an overhang structure, and the tip part TP of the emission connection part CE may be defined by a portion of the third layer L3*l*, which protrudes from the second layer L2.

The sixth insulation layer 60 and the pixel defining film PDL may expose at least a portion of the tip part TP and at least a portion of the side surface L2_W. Specifically, a first opening portion OP1 that exposes one side of the connection wiring CN may be defined in the sixth insulation layer 60, and a second opening portion OP2 overlapping the first opening portion OP1 may be defined in the pixel defining film PDL. The second opening portion OP2 may have a larger planar area than the first opening portion OP1. However, an embodiment of the inventive concept is not limited thereto, and the second opening portion OP2 may have a planar area smaller than or the same as the planar area of the first opening portion OP1 as long as exposing the least a portion of the tip part TP and the at least a portion of the side surface L2_W.

The intermediate layer IML may be disposed on the pixel defining film PDL. The intermediate layer IML may be disposed also on a partial region of the sixth insulation layer 60, which is exposed by the second opening portion OP2 of the pixel defining film PDL. The intermediate layer IML may be disposed also on a partial region of the connection wiring CN, which is exposed by the first opening portion OP1 of the sixth insulation layer 60. As illustrated in FIG. 6A, the intermediate layer IML may include one end IN1 disposed along a top surface of the fifth insulation layer 50, and the other end IN2 disposed along a top surface of the tip part TP of the connection wiring. That is, the intermediate layer IML may have a shape that is partially disconnected based on the tip part IP in a region in which the emission connection part CE is defined, when viewed on a cross section. However, the intermediate layer IML may have a shape of one body, which is entirely connected in the region (see FIG. 4) defined as a closed line by the separator, when viewed on a plan view.

The second electrode EL2 may be disposed on the intermediate layer IML. The second electrode EL2 may be disposed also on a part of the sixth insulation layer 60 that is aligned with the second opening portion OP2 of the pixel defining film PDL. The second electrode EL2 may be disposed also on a part of the connection wiring CN that is exposed by the first opening portion OP1 of the sixth insulation layer 60. As illustrated in FIG. 6A, the second electrode EL2 may include one end EN1 disposed along the top surface of the fifth insulation layer 50, and the other end EN2 disposed along the top surface of the tip part TP of the connection wiring. That is, the second electrode EL2 may have a shape that is partially disconnected based on the tip part IP in the region in which the emission connection part CE is defined, when viewed on a cross section. However, in plan view, the second electrode EL2 may have a continuous shape in the region (see FIG. 4B) defined as the closed line by the separator.

as depicted in FIG. 6A, the one end EN1 of the second electrode EL2 may be disposed along the side surface of the second layer L2 and in contact with the side surface L2_W of the second layer L2. Specifically, the second electrode EL2 may be formed to be in contact with the side surface L2_W of the second layer L2, which is exposed from the intermediate layer IML by the tip part TP, based on a deposition angle difference between the second electrode EL2 and the intermediate layer IML. That is, the second electrode EL2 may be connected to the connection wiring CN without a separate patterning process of the intermediate layer IML and accordingly, the light emitting device LD may be electrically connected to the pixel driver PDC through the connection wiring CN.

Although the other end IN2 of the intermediate layer IML and the other end EN2 of the second electrode EL2 cover the side surface L3_W of the third layer L3 in this embodiment, this is illustrated as an example. At least a portion of the side surface L3_W of the third layer L3 may be also exposed from the other end IN2 of the intermediate layer IML and/or the other end EN2 of the second electrode EL2.

As described above, the display panel DP may include the separator SPR. The separator SPR may be disposed on the pixel defining film PDL. In an embodiment, the second electrode EL2 and the intermediate layer IML may be deposited and formed, in common, on the plurality of pixels through an open mask. Here, the second electrode EL2 and the intermediate layer IML may be divided by the separator SPR. As described above, the separator SPR may have a shape of a closed line with respect to each of the emitting parts and accordingly, the second electrode EL2 and the intermediate layer IML may a shape divided in each of the emitting parts. That is, the second electrode EL2 and the intermediate layer IML may be electrically independent in each of adjacent pixels.

The separator SPR will be described in more detail with reference to FIGS. 5 and 6B. As illustrated in FIG. 6B, the separator SPR may have a reverse tapered shape. That is, an angle θ (hereinafter referred to as a taper angle) of a side surface SPR_W of the separator SPR with respect to a top surface of the pixel defining film PDL may be an obtuse angle. However, this is illustrated as an example, the taper angle θ may be varied as long as the separator SPR may electrically disconnect the second electrode EL2 in each of the pixels. The separator SPR may have the same structure as the tip part TP, and is not limited to any one embodiment.

In an embodiment, the separator SPR may include a material having an insulating property, and particularly, may include an organic insulating material. The separator SPR may include an inorganic insulating material, may include multiple layers made of the organic insulating material, respectively, or may include a conductive material according to an embodiment. That is, the separator SPR is not particularly limited by the type of the material as long as electrically disconnecting the second electrode EL2 in each of the pixels.

A dummy layer UP may be disposed on an upper portion of the separator SPR. The dummy layer UP may include a first dummy layer UP1 disposed on the separator SPR, and a second dummy layer UP2 disposed on the first dummy layer UP1. The first dummy layer UP1 may be formed through the same process as the intermediate layer IML and include the same material as the intermediate layer IML. The second dummy layer UP2 may be formed through the same process as the second electrode EL2 and include the same material as the second electrode EL2. That is, the first dummy layer UP1 and the second dummy layer UP2 may be simultaneously formed during forming of the intermediate layer IML and the second electrode EL2, respectively. In another embodiment, the display panel DP may not include the dummy layer UP.

As illustrated in FIG. 6B, in an embodiment, the second electrode EL2 may include a first end portion EN1$a$, and the second dummy layer UP2 may include a second end portion EN2$a$. The first end portion EN1$a$ may be spaced apart from the separator SPR and disposed on the pixel defining film PDL, and the second end portion EN2$a$ may be separated from the first end portion EN1$a$ and disposed on the side surface SPR_W of the separator SPR. Although FIG. 6B illustrates that the first end portion EN1$a$ is spaced a predetermined gap from the side surface SPR_W of the separator SPR, an embodiment of the inventive concept is not limited thereto. The first end portion EN1$a$ may be also in contact with the side surface SPR_W of the separator SPR as long as being electrically disconnected with the second end portion EN2$a$. Even though the first end portion EN1$a$ and the second end portion EN2$a$ are connected to each other without being separated from each other, when a portion, which is formed along the side surface SPR_W of the separator SPR, is thin and thus has high electrical resistance so that the second electrode EL2 between adjacent pixels is electrically disconnected, the second electrode EL2 may be considered to be divided by the separator SPR.

According to the present disclosure, the second electrode EL2 or the intermediate layer IML may not be formed at the side surface SPR_W of the separator SPR or may be formed to have a small thickness even without a separate patterning process of the second electrode EL2 or the intermediate layer IML. Accordingly, the second electrode EL2 or the intermediate layer IML may be divided for each pixel. As long as the second electrode EL2 or the intermediate layer IML may be electrically disconnected between the pixels, the shape of the separator SPR may be variously modified, and is not limited to any one embodiment.

Referring to FIG. 5 again, the encapsulation layer ECL may be disposed on the light emitting device layer LDL. The encapsulation layer ECL may cover the light emitting device LD, and may cover the separator SPR. The encapsulation layer ECL may include a first inorganic layer IL1, an organic layer OL, and a second inorganic layer IL2 that are sequentially stacked. However, an embodiment of the inventive concept is not limited thereto, and the encapsulation layer ECL may further include a plurality of inorganic layers and organic layers. The encapsulation layer ECL may be a glass substrate.

The first and second inorganic layers IL1 and IL2 may protect the light emitting device LD from moisture and oxygen outside the display panel DP, and the organic layer OL may protect the light emitting device LD from foreign matters such as particles remaining during forming of the first inorganic layer IL1. The first and second inorganic layers IL1 and IL2 may each include a silicon nitride layer, a silicon oxynitride layer, a silicon oxide layer, a titanium oxide layer, an aluminum oxide layer, or the like. The organic layer OL may include an acrylic organic layer, and the type of the material is not limited to any one material.

The sensing layer ISL may detect an external input. In this embodiment, the sensing layer ISL may be formed on the encapsulation layer ECL through a continuous process. Here, the sensing layer ISL may be expressed as being disposed directly on the encapsulation layer ECL. The expression "being disposed directly" may mean that another component is not disposed between the sensing layer ISL and the encapsulation layer ECL. That is, a separate adhesive member may not be disposed between the sensing layer ISL and the encapsulation layer ECL. However, this is illustrated as an example. In the display panel DP according to an embodiment of the inventive concept, the sensing layer ISL may be separately formed and then coupled to the display panel DP through an adhesive member, and is not limited to any one embodiment.

The sensing layer ISL may include a plurality of conductive layers and a plurality of insulation layers. The plurality of conductive layers may include a first sensing conductive layer MTL1 and a second sensing conductive layer MTL2, and the plurality of insulation layers may include first to third sensing insulation layers 71, 72 and 73. However, this is illustrated as an example, and each of the number of conductive layers and the number of insulation layers is not limited to any one embodiment.

The first to third sensing insulation layers 71, 72 and 73 may have a single-layer structure or a multilayer structure in which layers are stacked in the third direction DR3. The inorganic film may include at least one of an aluminum oxide, a titanium oxide, a silicon oxide, silicon nitride, a silicon oxynitride, a zirconium oxide, and a hafnium oxide. The first to third sensing insulation layers 71, 72 and 73 may further include an organic film. The organic film may include at least one of an acrylic-based resin, a methacryl-based resin, polyisoprene-based resin, a vinyl-based resin, an epoxy-based resin, a urethane-based resin, a cellulose-based resin, a siloxane-based resin, a polyimide-based resin, a polyamide-based resin, and a perylene-based resin.

The first sensing conductive layer MTL1 may be disposed between the first sensing insulation layer 71 and the second sensing insulation layer 72, and the second sensing conductive layer MTL2 may be disposed between the second sensing insulation layer 72 and the third sensing insulation layer 73. A portion of the second sensing conductive layer MTL2 may be connected to the first sensing conductive layer MTL1 through a contact hole CNT formed in the second sensing insulation layer 72. Each of the first sensing conductive layer MTL1 and the second sensing conductive layer MTL2 may have a single-layer structure or a multi-layer structure in which layers are stacked in the third direction DR3.

The sensing conductive layer having a single-layer structure may include a metal layer or a transparent conductive layer. The metal layer may include molybdenum, silver, titanium, copper, aluminum, or an alloy thereof. In addition, the transparent conductive layer may include a conductive polymer such as Poly (3,4-ethylenedioxythiophene)-poly (styrenesulfonate) (PEDOT), metal nanowire, graphene, or the like.

The sensing conductive layer having a multilayer structure may include metal layers. The metal layers may have, for example, a three-layer structure of titanium (Ti)/aluminum (Al)/titanium (Ti). Alternatively, the conductive layer having a multilayer structure may include at least one metal layer and at least one transparent conductive layer.

The first sensing conductive layer MTL1 and the second sensing conductive layer MTL2 may constitute a sensor that detects an external input in the sensing layer ISL. The sensor may be driven by a capacitance method, and may be driven by any one of a mutual capacitance method and a self-capacitance method. However, this is described as an example. The sensor may be driven by a resistive method, an ultrasonic method, or an infrared method, in addition to the capacitance method, and is not limited to any one embodiment.

Each of the first sensing conductive layer MTL1 and the second sensing conductive layer MTL2 may include a transparent conductive oxide, and also may have a metal mesh shape formed of an opaque conductive material. Each of the first sensing conductive layer MTL1 and the second sensing conductive layer MTL2 may have various materials and various shapes as long as visibility of an image displayed by the display panel DP is not reduced.

Figure 7:
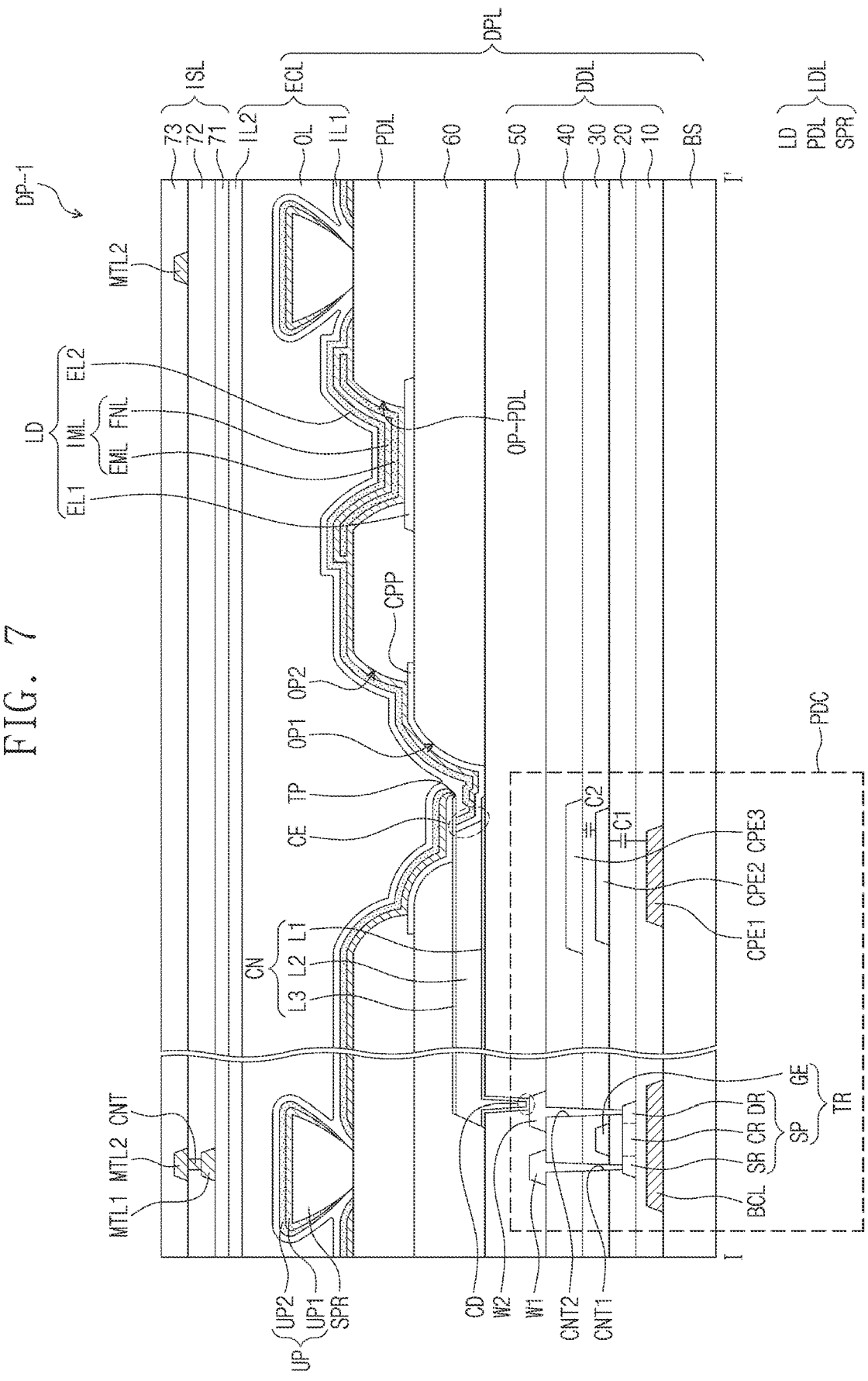
FIG. 7 is a cross-sectional view of a display panel according to an embodiment of the inventive concept.

FIG. 7 is a cross-sectional view of a display panel according to an embodiment of the inventive concept. For ease of explanation, FIG. 7 illustrates a cross-sectional view of a region corresponding to the region in FIG. 5. Hereinafter, the same/similar components as/to those described with reference to FIGS. 1 and 6B are denoted as the same/similar reference numbers or symbols, and duplicate description is omitted.

A display panel DP-1 illustrated in FIG. 7 may further include a capping pattern CPP unlike the display panel DP illustrated in FIG. 5. The capping pattern CPP may be disposed on a sixth insulation layer 60. The capping pattern CPP may be disposed also on a partial region of a connection wiring CN, which is exposed by a first opening portion OP1 of the sixth insulation layer 60. The capping pattern CPP may be disposed to overlap the connection wiring CN, and specifically, may be disposed to overlap an emission connection part CE and/or a tip part TP.

As illustrated in FIG. 7, the capping pattern CPP may have a shape that is partially disconnected based on the tip part TP in a region in which the emission connection part CE is defined, when viewed on a cross section. However, in plan view, the capping pattern CPP may have a continuous shape in the region (see FIG. 4) defined as a closed line by a separator. One end portion of the capping pattern CPP, which is partially disconnected, may be in contact with a side surface of a connection wiring second layer L2, and another end portion of the capping pattern CPP may be disposed on an upper portion of a connection wiring third layer L3 and cover the tip part TP.

The capping pattern CPP may include a conductive material. Accordingly, a second electrode EL2 may be electrically connected to the connection wiring CN through the capping pattern CPP. That is, the capping pattern CPP may be in contact with the side surface of the connection wiring second layer L2 and then the second electrode EL2 may be in contact with the capping pattern CPP, so that these all may be electrically connected to each other. The second electrode EL2 may be electrically connected to the second layer L2 only by disposing capping pattern CPP relatively outward from the connection wiring second layer L2 and connecting the second electrode EL2 to the capping pattern CPP instead of the side surface of the second layer L2. Accordingly, the connection wiring CN and the second electrode EL2 may be more easily connected.

The capping pattern CPP may include a material having a relatively lower reactivity than the connection wiring second layer L2. For example, the capping pattern CPP may include copper (Cu), silver (Ag), a transparent conductive oxide, or the like. The side surface of the connection wiring second layer L2 may be protected by the capping pattern CPP having a relatively lower reactivity, thereby preventing oxidation of a material included in the second layer L2. Moreover, a phenomenon may be prevented in which a silver (Ag) component included in a first electrode EL1 is reduced and particles causing a defect remains during an etching process of patterning the first electrode EL1.

In an embodiment, the capping pattern CPP may be formed through the same process as the first electrode EL1 and include the same material as the first electrode EL1. However, this is described as an example. The capping pattern CPP may be formed through a different process from the first electrode EL1 and may include a different material, and is not limited to any one embodiment.

Figure 8:
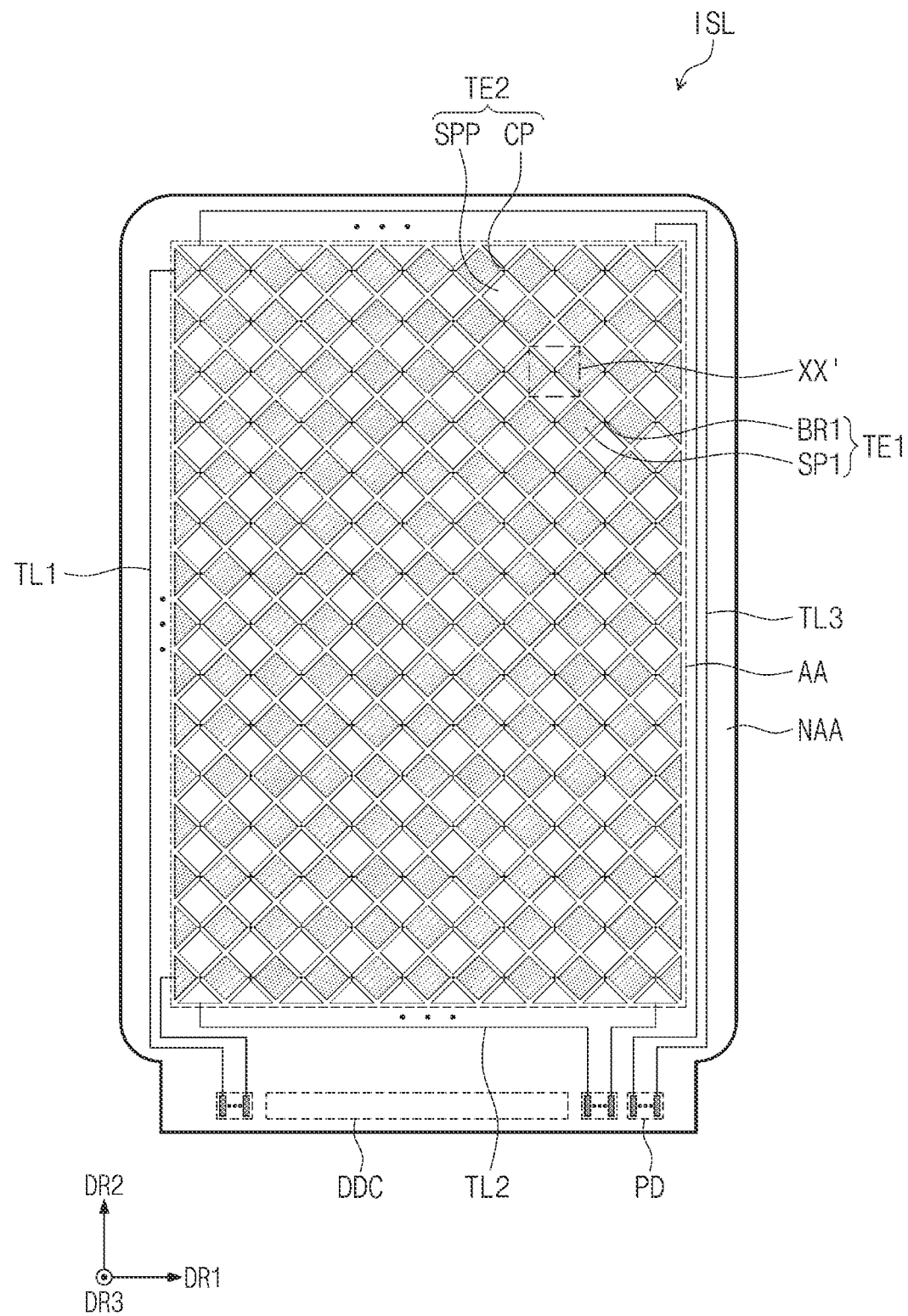
FIG. 8 is a plan view of a sensing layer according to an embodiment of the inventive concept.

FIG. 8 is a plan view of a sensing layer ISL according to an embodiment of the inventive concept.

Referring to FIG. 8, the sensing layer ISL may include an active region AA and a sensing peripheral region NAA. The active region AA may correspond to the display region DA (see FIG. 3A) of the display panel DP (see FIG. 3A), and the sensing peripheral region NAA may correspond to the peripheral region NDA (see FIG. 3A) of the display panel DP. Although FIG. 8 exemplarily illustrates the active region AA having a rectangular frame shape and the sensing peripheral region NAA having a rectangular frame shape surrounding the active region AA, each of the active region AA and the sensing peripheral region NAA is not limited to the shapes and positions in FIG. 8.

The sensing layer ISL may include a plurality of sensing electrodes TE1 and TE2, which are arranged in the active region AA, and a plurality of signal lines TL1, TL2 and TL3 and a plurality of pads PD, which are disposed in the sensing peripheral region NAA.

The plurality of sensing electrodes TE1 and TE2 may include a plurality of first sensing electrodes TE1 and a plurality of second sensing electrodes TE2. The plurality of first sensing electrodes TE1 may extend in the first direction DR1 and arranged in the second direction DR2. The plurality of second sensing electrodes TE2 may extend in the second direction DR2 and arranged in the first direction DR1. The plurality of first sensing electrodes TE1 and the plurality of second sensing electrodes TE2 may extend so as to be insulated from and intersect with each other.

Each of the plurality of first sensing electrodes TE1 may include a plurality of first sensing patterns SP1, which are arranged in the first direction DR1, and a plurality of first bridge patterns BR1 electrically connected to the plurality of first sensing patterns SP1. Two first sensing patterns SP1 of the plurality of first sensing patterns SP1, which are adjacent to each other, may be electrically connected to each other by two first bridge patterns BR1 of the plurality of first bridge patterns BR1, which are adjacent to each other. For example, two first bridge patterns BR1 may be disposed between two first sensing patterns SP1, which are adjacent to each other in the first direction DR1, and electrically connect the two first sensing patterns SP1 to each other.

Each of the plurality of second sensing electrodes TE2 may include a plurality of sensing portions SPP, which are arranged in the second direction DR2, and a connection part CP electrically connected to the plurality of sensing portions SPP. The plurality of second sensing electrodes TE2 may be disposed on the same layer as the plurality of first sensing patterns SP1. The plurality of sensing portions SPP and the connection part CP may be integrated. The connection part CP may be disposed between two sensing portions SPP, which are adjacent to each other in the second direction DR2, and electrically connect the two sensing portions SPP to each other. The connection part CP may be defined as a portion of the plurality of second sensing electrodes TE2 intersecting with the plurality of first bridge patterns BR1 of the plurality of first sensing electrodes TE1. The connection part CP and the plurality of first bridge patterns BR1 may be disposed on different layers and insulated from and intersect with each other.

The plurality of signal lines TL1, TL2 and TL3 may include a plurality of first signal lines TL1, which are connected to the plurality of first sensing electrodes TE1, and a plurality of second and third signal lines TL2 and TL3 which are connected to the plurality of second sensing electrodes TE2. A driving signal may be applied to the plurality of first sensing electrodes TE1 through the plurality of first signal lines TL1, and a change in capacitance, which is formed between the plurality of first and second signal lines TL1 and TL2, may be output as a sensing signal through the plurality of second and third signal lines TL2 and TL3.

The plurality of first signal lines TL1 may have one ends that are connected to one ends of the plurality of first sensing electrodes TE1. The plurality of first signal lines TL1 may extend to the sensing peripheral region NAA at a lower side, and the plurality of first signal lines TL1 may have the other ends that are connected to the plurality of pads PD.

each of the plurality of second signal lines TL2 may have one end that is connected to at least one of the plurality of second sensing electrodes TE2, and each of the plurality of third signal lines TL3 may have one end that is connected to at least one of the plurality of second sensing electrodes TE2. The plurality of second and third signal lines TL2 and TL3 may extend to the sensing peripheral region NAA, and the plurality of second and third signal lines TL2 and TL3 may have the other ends that are connected to the plurality of pads PD.

The plurality of first signal lines TL1 connected to the plurality of first sensing electrodes TE1 may be transmission lines, and the plurality of second and third signal lines TL2 and TL3 connected to the plurality of second sensing electrodes TE2 may be reception lines. However, in some embodiments, the plurality of first signal lines TL1 may be reception lines, and the plurality of second and third signal lines TL2 and TL3 may be transmission lines.

The plurality of pads PD may be in the sensing peripheral region NAA that is adjacent to a one side of the active region AA on a plan view. FIG. 8 exemplarily illustrates that the plurality of pads PD are arranged next to a data driver DDC. However, an embodiment of the inventive concept is not limited thereto.

Figure 9:
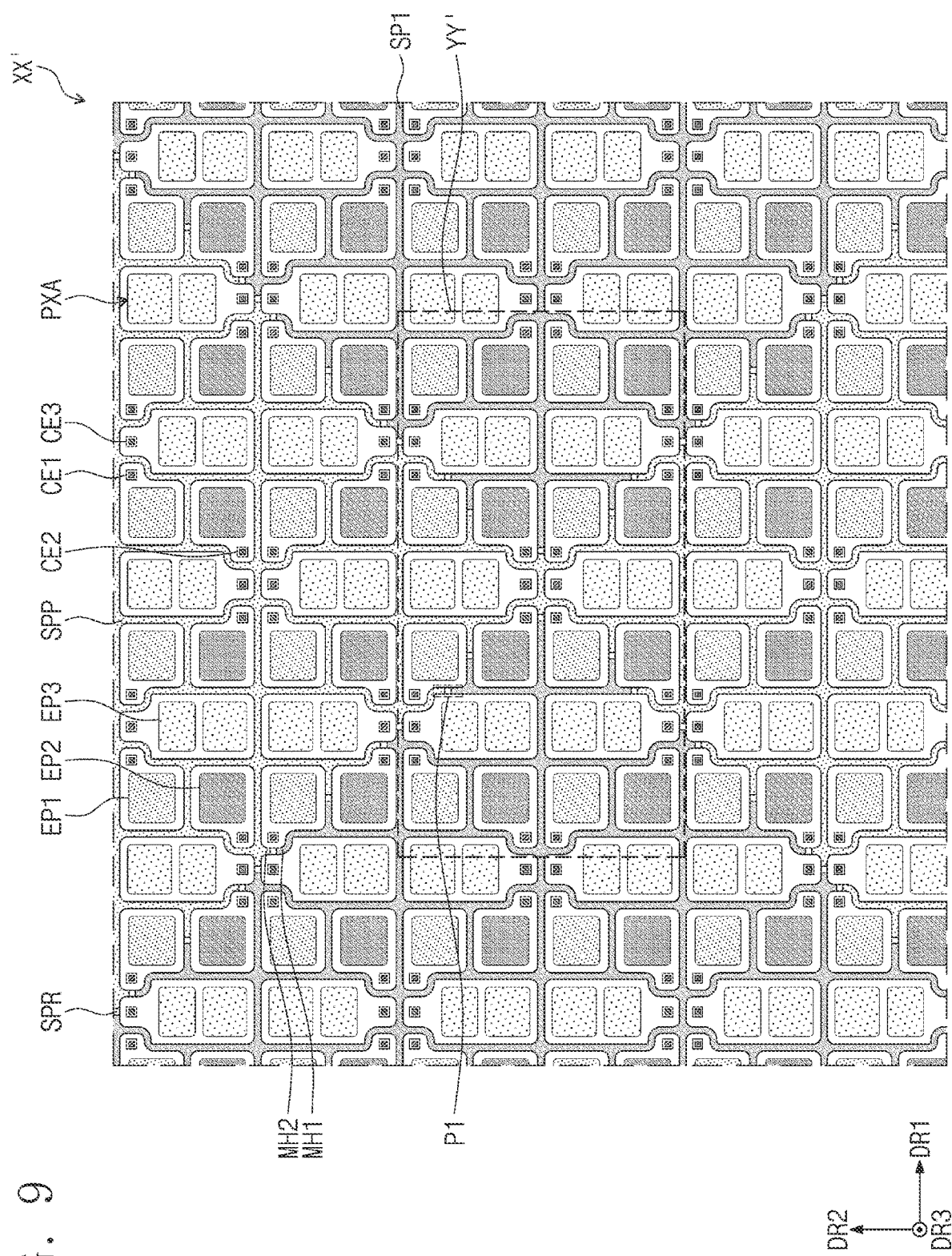
FIG. 9 is an enlarged view of a region corresponding to region XX' in FIG. 8.

FIG. 9 is an enlarged view of a region corresponding to region XX' in FIG. 8. Regarding FIG. 9, description will be given with reference to FIG. 4A, and description of components denoted as the same reference symbols is omitted.

FIG. 9 illustrates a separator SPR, a plurality of emitting parts EP1, EP2 and EP3 disposed in regions divided by the separator SPR, a plurality of first connection parts CE1, CE2 and CE3 (hereinafter referred to as the plurality of emission connection parts) of the connection wiring CN (see FIG. 4A), a plurality of first sensing patterns SP1 of the plurality of first sensing electrodes TE1 (see FIG. 8), and a plurality of sensing portions SPP of the plurality of second sensing electrodes TE2 (see FIG. 8) among components of a display panel.

Referring to FIGS. 7 and 9, a region in which light emitted by a light emitting device LD is displayed in a display layer DPL may be defined as an emission region PXA. The emission region PXA may be provided in plurality, and a plurality of emission regions PXA may correspond to shapes of a plurality of emitting parts EP1, EP2 and EP3, respectively.

The plurality of first sensing electrodes TE1 and the plurality of second sensing electrodes TE2 may be provided to overlap the separator SPR on a plan view. The plurality of first sensing electrodes TE1 and the plurality of second sensing electrodes TE2 may include mesh lines MH1 and MH2, respectively. One first sensing pattern SP1 of the plurality of first sensing patterns SP1 may include a first mesh line MH1, and one second sensing electrode TE2 of the plurality of second sensing electrodes TE2 may include a second mesh line MH2.

The first mesh line MH1 and the second mesh line MH2 may be spaced apart from each other between two emission regions PXA of the plurality of emission regions PXA, which are adjacent to each other in the first direction DR1, and the first mesh line MH1 and the second mesh line MH2 spaced apart from each other may extend in the second direction DR2, when viewed on a plan view. FIG. 9 exemplarily illustrates that the second mesh lines MH2 of the plurality of second sensing electrodes TE2 may be connected to each other and formed as one body, but an embodiment of the inventive concept is not limited thereto.

The first to third directions DR1, DR2 and DR3 are shown in the accompanying drawings, and the first to third directions DR1, DR2 and DR3 used herein are relative concepts and may be changed to other directions. The directions indicated by the first to third directions DR1, DR2 and DR3 in each of the drawings are shown by using the same reference numbers or symbols.

The first mesh line MH1 and the second mesh line MH2 may be spaced apart from each other between the plurality of first connection parts CE1, CE2 and CE3. In detail, the first mesh line MH1 and the second mesh line MH2 may be spaced apart from each other between a first emitting part EP1 and a second emitting part EP2 and between the plurality of first connection parts CE1, CE2 and CE3. However, this is an example, and an embodiment of the inventive concept is not limited thereto. For example, the first mesh line MH1 and the second mesh line MH2 may be spaced apart from each other between two emitting parts of the plurality of emitting parts EP1, EP2 and EP3 and between the plurality of first connection parts CE1, CE2 and CE3 (or the plurality of emission connection parts).

Each of the first to third emission connection parts CE1, CE2 and CE3 may be connected to the second electrode EL2_1, EL2_2 or EL2_3 (see FIG. 4B) of the light emitting device. A variable voltage is applied to the second electrode EL2_1, EL2_2 or EL2_3 (see FIG. 4B). The first mesh line MH1 of the plurality of first sensing electrodes TE1 and the second mesh line MH2 of the plurality of second sensing electrodes TE2 may be spaced apart from each other in a region adjacent to the emission connection parts CE1, CE2 and CE3. Thus, influence due to an electric field fluctuation generated in the region adjacent to the emission connection parts CE1, CE2 and CE3 may be reduced, and touch noise caused by the electric field fluctuation may be reduced or removed.

Figure 10:
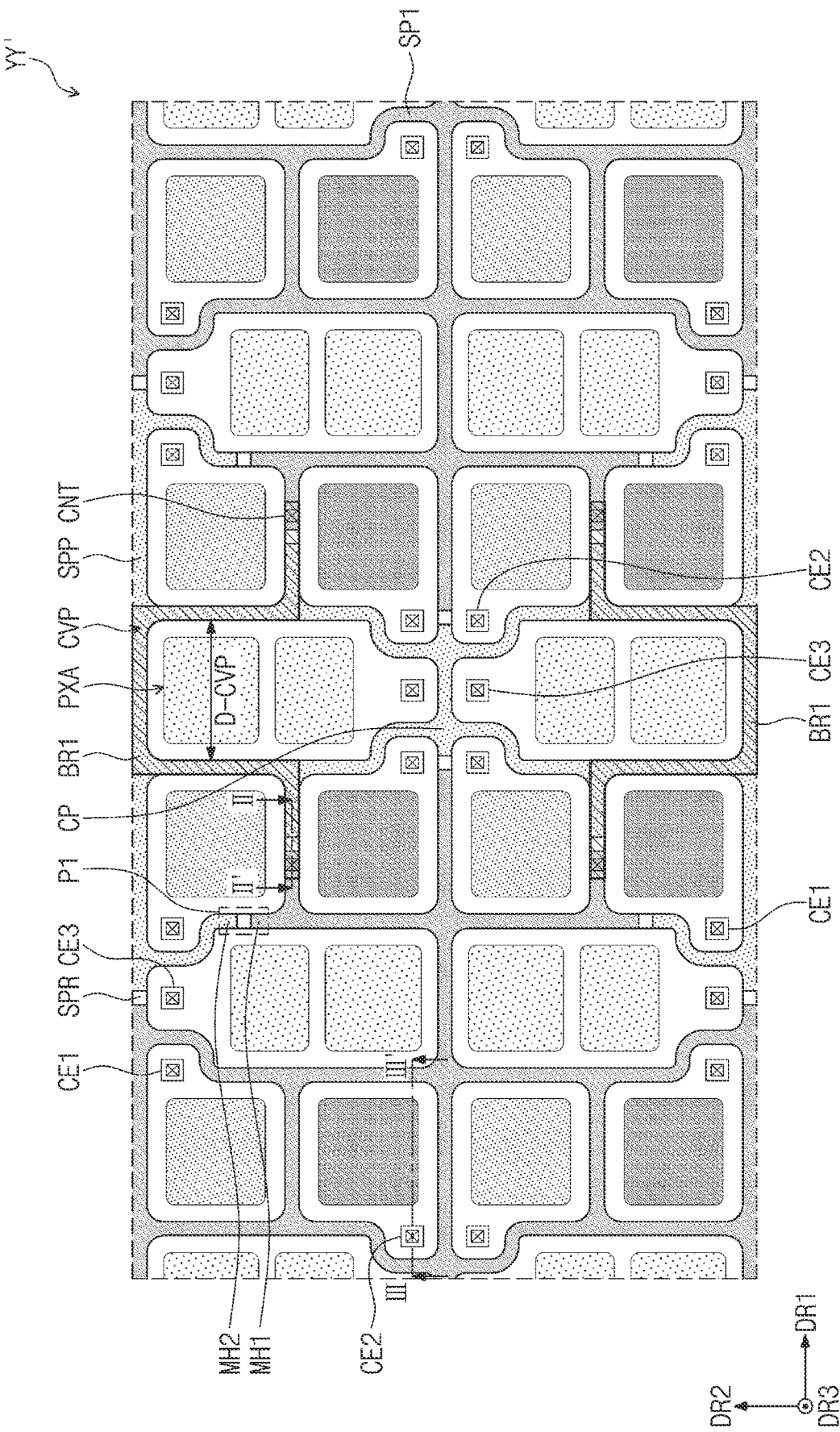
FIG. 10 is an enlarged view of a region corresponding to region YY' in FIG. 9.

FIG. 10 is an enlarged view of a region corresponding to region YY' in FIG. 9. Regarding FIG. 10, description will be given with reference to FIG. 9, and description of components denoted as the same reference symbols is omitted. FIG. 10 illustrates the components of the display panel, which are illustrated in FIG. 9, and a plurality of first bridge patterns BR1.

Referring to FIG. 10, two first bridge patterns BR1 may be disposed between two first sensing patterns SP1, which are adjacent to each other in the first direction DR1, and electrically connect the two first sensing patterns SP1 to each other. Each of the plurality of first bridge patterns BR1 may be spaced apart from a plurality of first connection parts CE1, CE2 and CE3 with at least one emission region PXA of a plurality of emission regions PXA therebetween, when viewed on a plan view. Each of the plurality of first bridge patterns BR1 may include a bending portion CVP, and the bending portion CVP may have a width D-CVP that is greater than a width of the emission region PXA, when viewed on a plan view.

According to the present disclosure, each of the plurality of first bridge patterns BR1 may be disposed to be spaced apart from the plurality of emission connection parts CE1, CE2 and CE3 with the emission region PXA therebetween. Thus, influence due to an electric field fluctuation generated in a region adjacent to the emission connection parts CE1, CE2 and CE3 may be reduced, and touch noise caused by the electric field fluctuation may be reduced.

A separator SPR may include a first portion P1. The first portion P1 may be a portion of the separator SPR that extends in the second direction DR2 between two emission regions PXA that are adjacent to each other in the first direction DR1. FIG. 10 exemplarily illustrates the first portion P1 disposed between the first emitting part EP1 (see FIG. 4A) and the third emitting part EP3 (see FIG. 4A), but an embodiment of the inventive concept is not limited thereto.

A first mesh line MH1 and a second mesh line MH2 may be spaced apart from each other between two emission regions PXA of the plurality of emission regions PXA, which are adjacent to each other in the first direction DR1, and the first mesh line MH1 and the second mesh line MH2 spaced apart from each other may extend in the second direction DR2, when viewed on a plan view. The first mesh line MH1 and the second mesh line MH2 may be spaced apart from another in the second direction DR2. The first mesh line MH1 and the second mesh line MH2 may overlap the first portion P1 of the separator SPR, which extends in the second direction DR2 in plan view.

Figure 11:
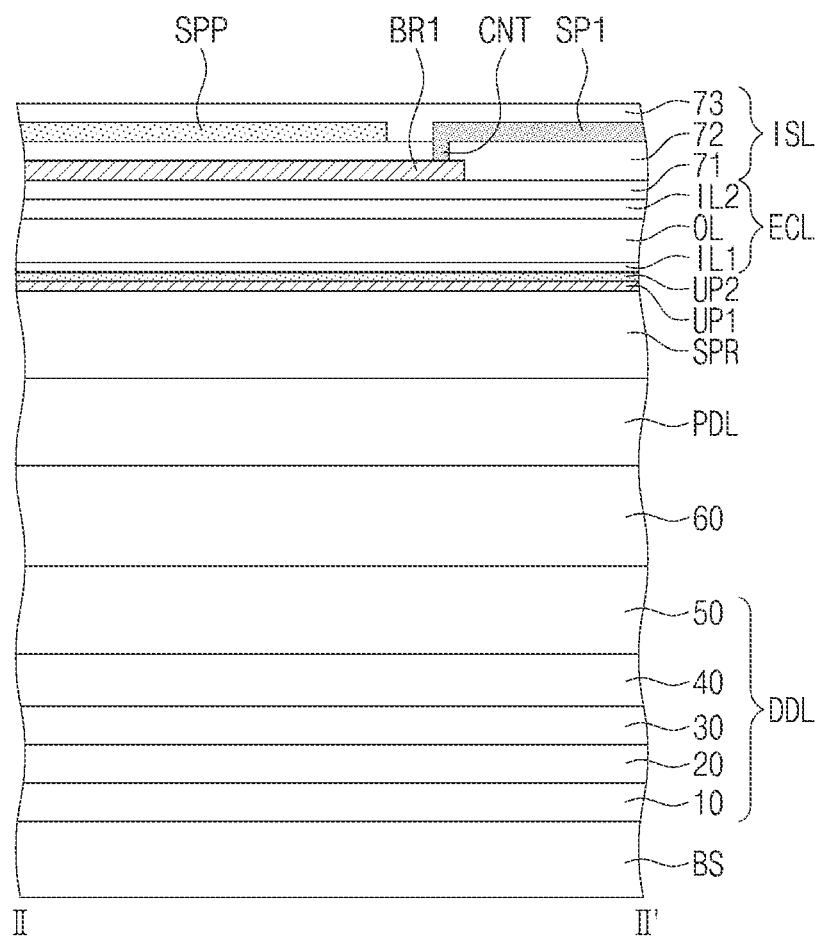
FIG. 11 is a cross-sectional view taken along line II-II' in FIG. 10.
Figure 11:
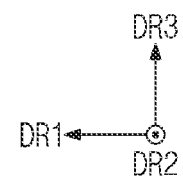

FIG. 11 is a cross-sectional view taken along line II-II' in FIG. 10. Regarding FIG. 11, description will be given with reference to FIG. 7, and description of components denoted as the same reference symbols is omitted.

Referring to FIGS. 7, 10 and 11, a first sensing conductive layer MTL1 may include a plurality of first bridge patterns BR1, and a second sensing conductive layer MTL2 may include a plurality of first sensing patterns SP1 and a plurality of sensing portions SPP of the plurality of second sensing electrodes TE2 (see FIG. 8). That is, the plurality of first bridge patterns BR1 may be disposed on a different layer from the plurality of first sensing patterns SP1 and the plurality of sensing portions SPP. For example, the plurality of first bridge patterns BR1 may be disposed on a first sensing insulation layer 71, and the plurality of first sensing patterns SP1 and the plurality of sensing portions SPP may be disposed on a second sensing insulation layer 72. The plurality of first sensing patterns SP1 may be connected to the plurality of first bridge patterns BR1 through a contact hole CNT defined in the second sensing insulation layer 72.

However, the arrangement of the plurality of first sensing patterns SP1, the plurality of first bridge patterns BR1, and the plurality of sensing portions SPP in FIG. 11 is an example, and an embodiment of the inventive concept is not limited thereto. For example, the first sensing conductive layer MTL1 may include the plurality of first sensing patterns SP1 and the plurality of sensing portions SPP of the plurality of second sensing electrodes TE2 (see FIG. 8), and the second sensing conductive layer MTL2 may include the plurality of first bridge patterns BR1. That is, the plurality of first sensing patterns SP1 and the plurality of sensing portions SPP may be disposed on the first sensing insulation layer 71, and the plurality of first bridge patterns BR1 may be disposed on the second sensing insulation layer 72. The plurality of first bridge patterns BR1 may be connected to the plurality of first sensing patterns SP1 through the contact hole CNT defined in the second sensing insulation layer 72.

Figure 12:
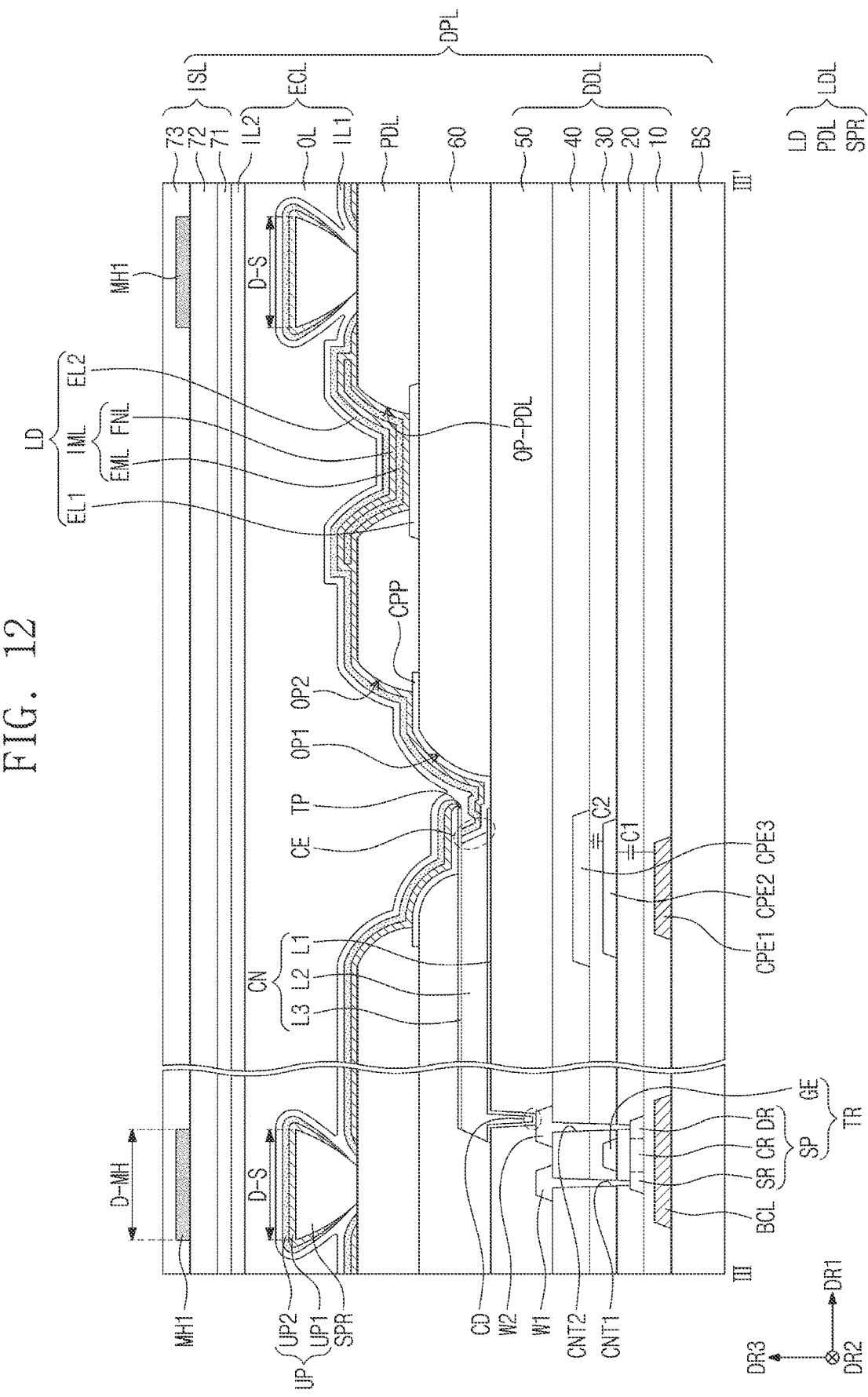
FIG. 12 is a cross-sectional view taken along line III-III' in FIG. 10.

FIG. 12 is a cross-sectional view taken along line III-III' in FIG. 10. Regarding FIG. 12, description will be given with reference to FIG. 7, and description of components denoted as the same reference symbols is omitted.

Referring to FIGS. 7, 10 and 12, each of first mesh lines MH1 may have a width D-MH that is narrower than or the same as a width D-S of a separator SPR. Likewise, each of second mesh lines MH2 may have a width that is the same as or narrower than the width D-S of the separator SPR.

According to the present disclosure, a plurality of first and second sensing electrodes TE1 and TE2 may be disposed to overlap the separator SPR on a plan view, and the width D-MH of each of the mesh lines MH1 and MH2 of the plurality of first and second sensing electrodes TE1 and TE2 may be the same as or narrower than the width D-S of the separator SPR. In this case, the plurality of first and second sensing electrodes TE1 and TE2 may have a reduced area overlapping the second electrode EL2_1, EL2_2 or EL2_3 (see FIG. 4B) of the light emitting device, to which a variable voltage is applied. Thus, coupling noise, which occurs between the plurality of first and second sensing electrodes TE1 and TE2 and the second electrode EL2_1, EL2_2 or EL2_3, may be reduced.

Figure 13:
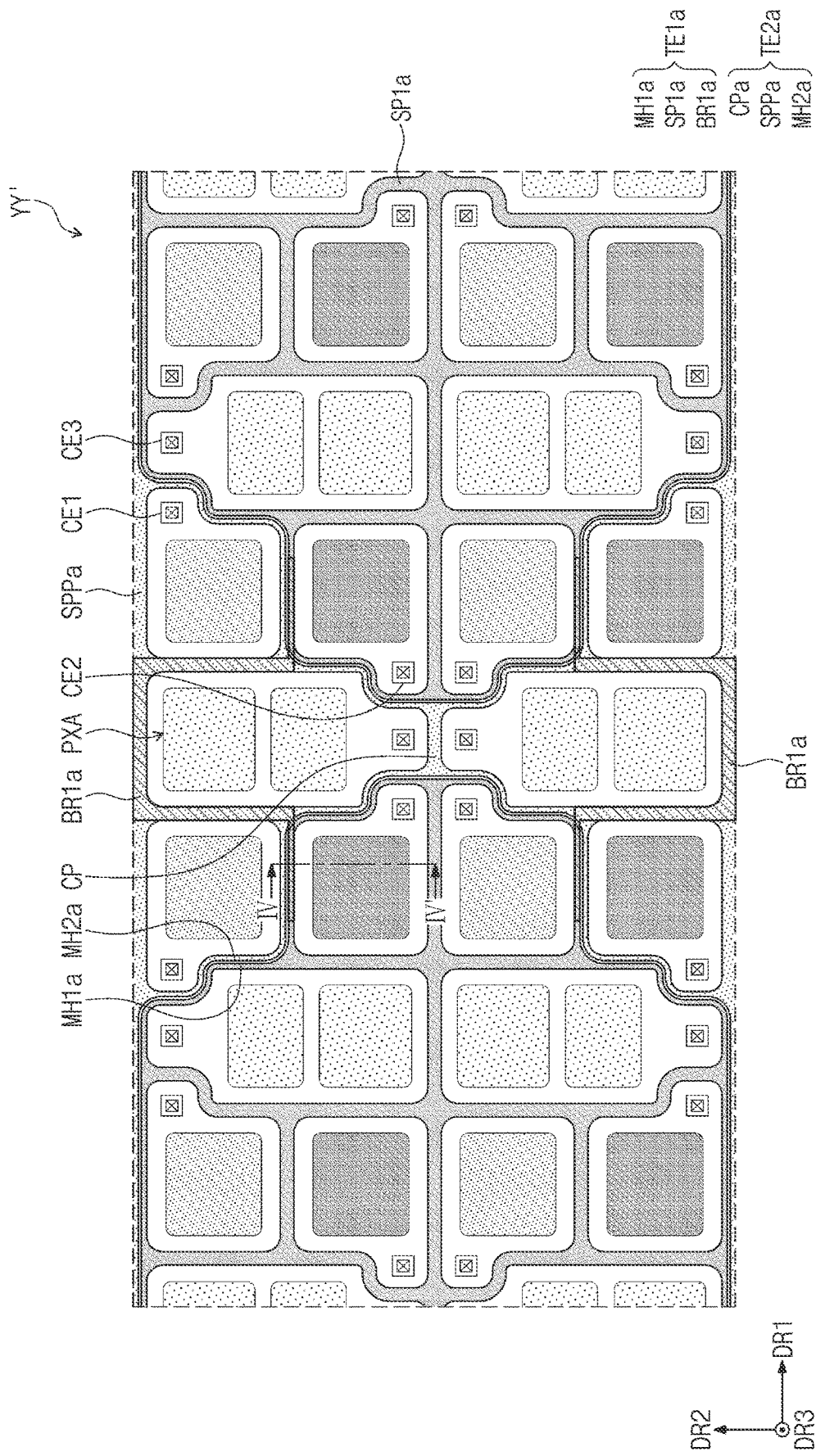
FIG. 13 is an enlarged view of a region corresponding to region YY' in FIG. 9.
Figure 14:
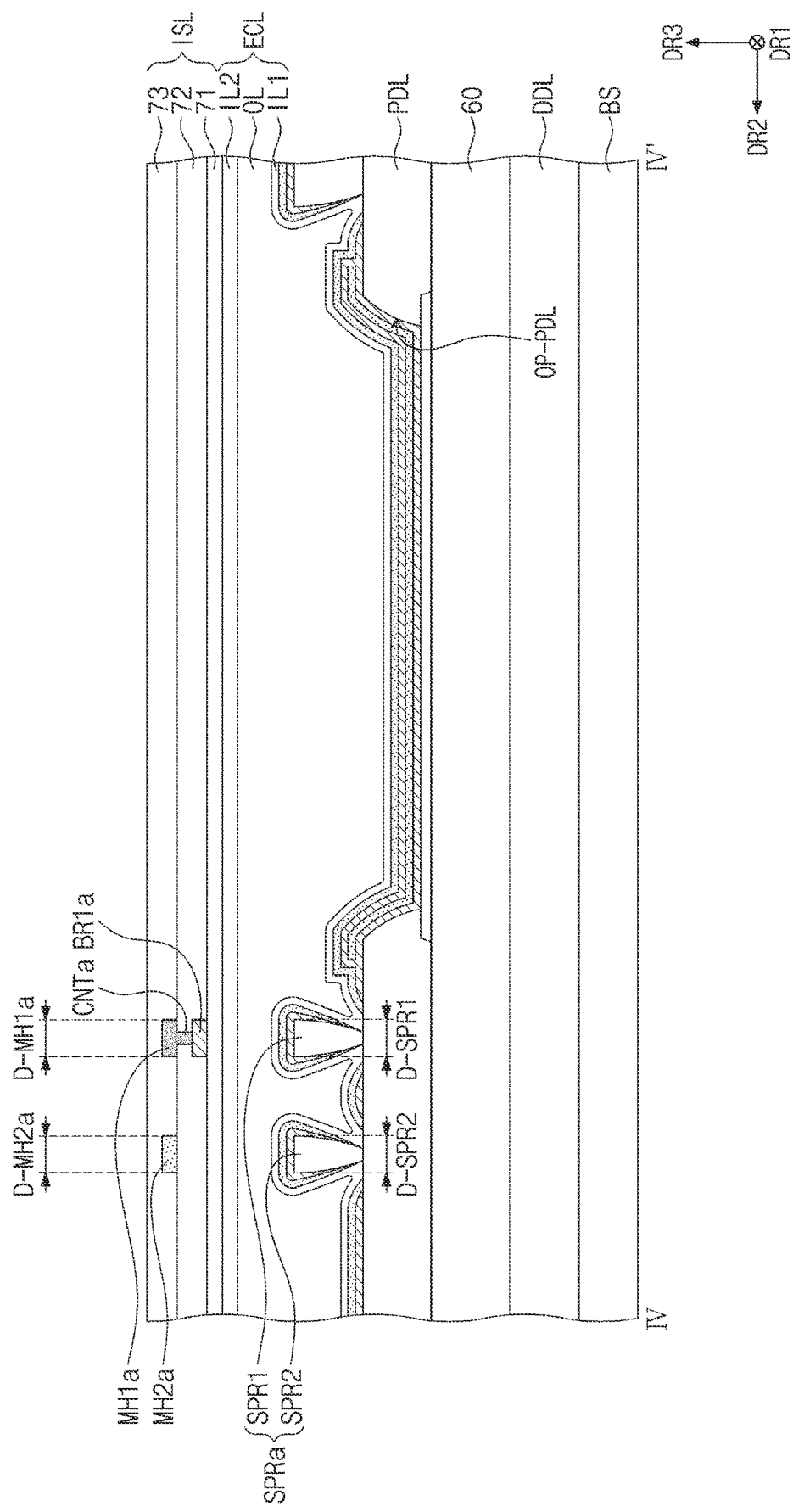
FIG. 14 is a cross-sectional view taken along line IV-IV' in FIG. 13.

FIG. 13 is an enlarged view of a region corresponding to region YY' in FIG. 9. FIG. 14 is a cross-sectional view taken along line IV-IV' in FIG. 13. Regarding FIGS. 13 and 14, description will be given with reference to FIGS. 10 to 12, and description of components denoted as the same reference symbols is omitted.

Referring to FIGS. 13 and 14, one first sensing electrode TE1a of a plurality of first sensing electrodes TE1a may include a first mesh line MH1a, and one second sensing electrode TE2a of a plurality of second sensing electrodes TE2a may include a second mesh line MH2a.

The first mesh line MH1a and the second mesh line MH2a may be spaced apart from each other between two emission regions PXA that are adjacent to each other in the first direction DR1, and the first mesh line MH1a and the second mesh line MH2a spaced apart from each other may extend in the second direction DR2 in plan view. For example, the first mesh line MH1a and the second mesh line MH2a may be arranged between the two emission regions PXA of the plurality of emission regions PXA, which are adjacent to each other in the first direction DR1, and the first mesh line MH1a and the second mesh line MH2a may be arranged to be spaced apart from each other in the first direction DR1. The first mesh line MH1a and the second mesh line MH2a may be spaced apart from each other between a plurality of first connection parts CE1, CE2 and CE3.

As the first mesh line MH1a and the second mesh line MH2a spaced apart from each other extends in the second direction DR2, a region to which each of the plurality of first and second sensing electrodes TE1a and TE2a is adjacent may have an increased area and consequently, touch sensitivity of the display device DD (see FIG. 1) may be improved.

The first mesh line MH1a and the second mesh line MH2a may be arranged to overlap a separator SPRa in plan view. In detail, the separator SPRa may include a first separator SPR1, and a second separator SPR2 spaced apart from the first separator SPR1 in the first direction DR1. The first separator SPR1 may overlap the first mesh line MH1a, and the second separator SPR2 may overlap the second mesh line MH2a. That is, the first mesh line MH1a may be arranged to overlap the first separator SPR1 in plan view, and the second mesh line MH2a may be arranged to overlap the second separator SPR2 in plan view. The first mesh line MH1a may have a width D-MH1a that is the same as or narrower than a width D-SPR1 of the first separator SPR1, and the second mesh line MH2a may have a width D-MH2a that is the same as or narrower than a width D-SPR2 of the second separator SPR2.

A plurality of first bridge patterns BR1a of the plurality of first sensing electrodes TE1a may be disposed between two first sensing patterns SP1a that are adjacent to each other in the first direction DR1, and electrically connect the two first sensing patterns SP1a to each other. Each of the plurality of first bridge patterns BR1a may be spaced apart from a plurality of first connection parts CE1, CE2 and CE3 with at least one emission region PXA of a plurality of emission regions PXA therebetween, in plan view. Some of the plurality of first bridge patterns BR1a may be arranged to overlap a plurality of sensing portions SPPa, and others of the plurality of first bridge patterns BR1a may be arranged to overlap the plurality of first sensing patterns SP1a in plan view. The plurality of first bridge patterns BR1a may be connected to the plurality of first sensing patterns SP1a through a contact hole CNTa defined in a second sensing insulation layer 72.

However, the arrangement of the plurality of first sensing patterns SP1a, the plurality of first bridge patterns BR1a, and the plurality of sensing portions SPPa in FIG. 14 is an example, and an embodiment of the inventive concept is not limited thereto. For example, a first sensing conductive layer MTL1 may include the plurality of first sensing patterns SP1a and the plurality of sensing portions SPPa of the plurality of second sensing electrodes TE2a (see FIG. 13), and a second sensing conductive layer MTL2 may include the plurality of first bridge patterns BR1a. That is, the plurality of first sensing patterns SP1a and the plurality of sensing portions SPPa may be disposed on a first sensing insulation layer 71, and the plurality of first bridge patterns BR1a may be disposed on the second sensing insulation layer 72. The plurality of first bridge patterns BR1a may be connected to the plurality of first sensing patterns SP1a through the contact hole CNTa defined in the second sensing insulation layer 72.

According to the present disclosure, each of the plurality of first bridge patterns BR1a may be disposed to be spaced apart from the plurality of emission connection parts CE1, CE2 and CE3 with the emission region PXA therebetween. The first mesh line MH1a of the plurality of first sensing electrodes TE1a and the second mesh line MH2a of the plurality of second sensing electrodes TE2a may be spaced apart from each other in a region adjacent to the emission connection parts CE1, CE2 and CE3. Thus, influence due to an electric field fluctuation generated in the region adjacent to the emission connection parts CE1, CE2 and CE3 may be reduced, and touch noise caused by the electric field fluctuation may be reduced.

The plurality of first and second sensing electrodes TE1*a* and TE2*a* may be disposed to overlap the separator SPRa on a plan view, and the width of each of the mesh lines MH1*a* and MH2*a* of the plurality of first and second sensing electrodes TE1*a* and TE2*a* may be the same as or narrower than the width of the separator SPRa. In this case, the plurality of first and second sensing electrodes TE1*a* and TE2*a* may have a minimized area overlapping the second electrode EL2_1, EL2_2 or EL2_3 (see FIG. 4B) of the light emitting device, to which a variable voltage is applied. Thus, coupling noise, which occurs between the plurality of first and second sensing electrodes TE1*a* and TE2*a* and the second electrode EL2_1, EL2_2 or EL2_3, may be reduced.

Figure 15:
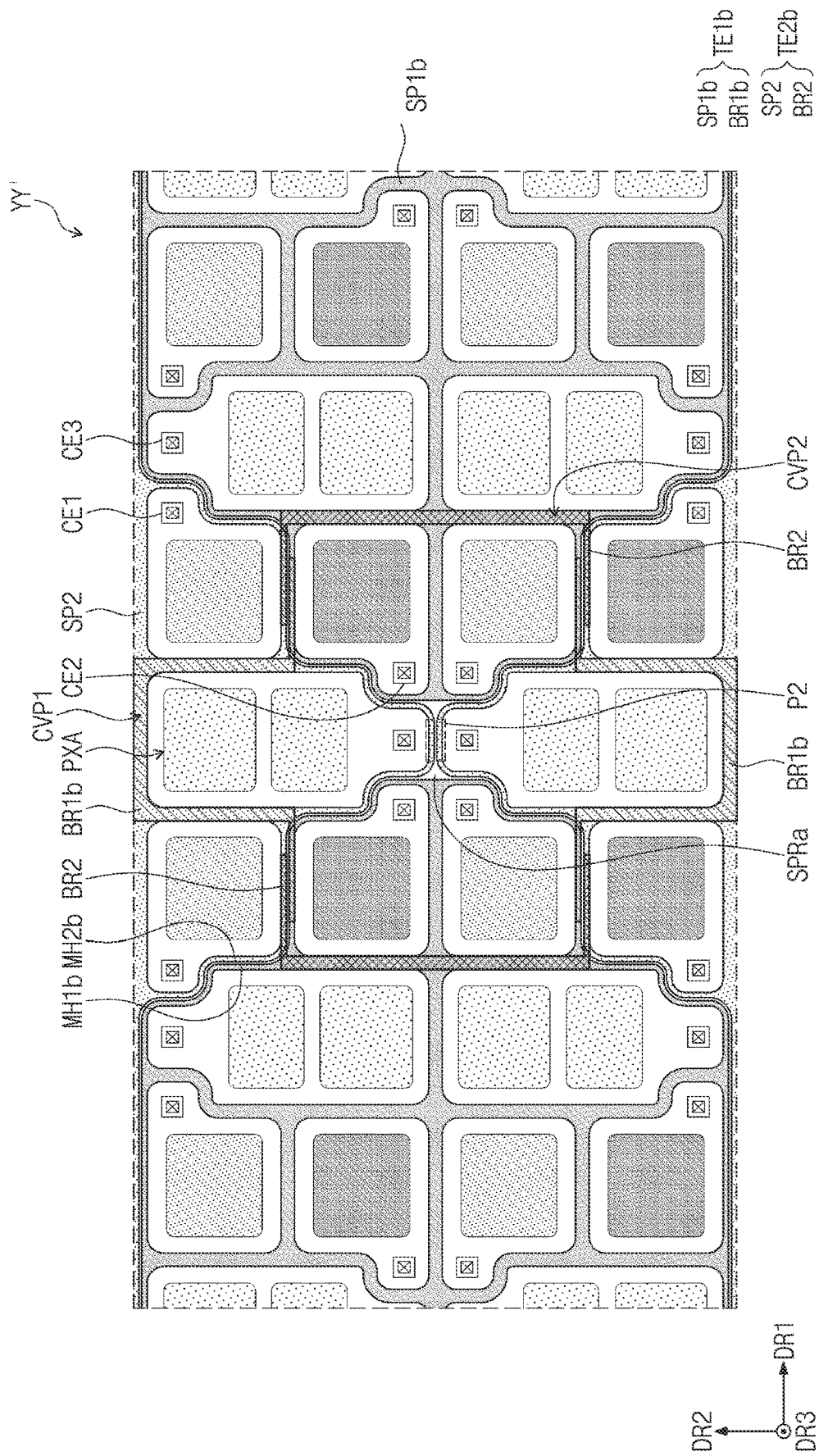
FIG. 15 is an enlarged view of a region corresponding to region YY' in FIG. 9.

FIG. 15 is an enlarged view of a region corresponding to region YY' in FIG. 9. Regarding FIG. 15, description will be given with reference to FIGS. 13 and 14, and description of components denoted as the same reference symbols is omitted.

Referring to FIG. 15, each of a plurality of first sensing electrodes TE1*b* may include a plurality of first sensing patterns SP1*b* that are arranged in the first direction DR1, and a plurality of first bridge patterns BR1*b* electrically connected to the plurality of first sensing patterns SP1*b*. Two first bridge patterns BR1*b* may be disposed between two first sensing patterns SP1*b* that are adjacent to each other in the first direction DR1, and electrically connect the two first sensing patterns SP1*b*. The plurality of first bridge patterns BR1*b* may be disposed on a different layer from the plurality of first sensing patterns SP1*b*.

Each of a plurality of second sensing electrodes TE2*b* may include a plurality of second sensing patterns SP2 that are arranged in the second direction DR2, and a plurality of second bridge patterns BR2 electrically connected to the plurality of second sensing patterns SP2. Two second bridge patterns BR2 may be disposed between two second sensing patterns SP2 that are adjacent to each other in the second direction DR2, and electrically connect the two second sensing patterns SP2. The plurality of second bridge patterns BR2 may be disposed on a different layer from the plurality of second sensing patterns SP2. In addition, the plurality of second bridge patterns BR2 may be disposed on the same layer as the plurality of first bridge patterns BR1*b*, or may be disposed on a different layer from the plurality of first bridge patterns BR1*b*.

Portions of two second sensing patterns SP2 may be spaced apart from each other in the second direction DR2 and positioned between two of a plurality of first connection parts CE1, CE2 and CE3 that are adjacent to each other in second direction DR2 in plan view. For example, two second sensing patterns SP2 disposed at a second portion P2 of a separator SPRa may be spaced apart from each other in second direction DR2 and positioned between third emission connection parts CE3 that are adjacent to each other in second direction DR2.

Each of the plurality of first bridge patterns BR1*b* may be spaced apart from the plurality of first connection parts CE1, CE2 and CE3 with at least one emission region PXA of a plurality of emission regions PXA therebetween, in plan view. Each of the plurality of first bridge patterns BR1*b* may include a first bending portion CVP1, and the first bending portion CVP1 may have a width that is greater than a width of the emission region PXA in plan view. Some of the plurality of first bridge patterns BR1*b* may be arranged to overlap the plurality of second sensing patterns SP2, and others of the plurality of first bridge patterns BR1*b* may be arranged to overlap the plurality of first sensing patterns SP1*b*, in plan view. The plurality of first bridge patterns BR1*b* may be connected, through a contact hole, to the plurality of first sensing patterns SP1*b* disposed on a different layer.

Each of the plurality of second bridge patterns BR2 may be spaced apart from the plurality of first connection parts CE1, CE2 and CE3 with at least one emission region PXA of the plurality of emission regions PXA therebetween, in plan view. Each of the plurality of second bridge patterns BR2 may include a second bending portion CVP2, and the second bending portion CVP2 may have a width that is greater than a width of the emission region PXA in plan view. Some of the plurality of second bridge patterns BR2 may be arranged to overlap the plurality of first sensing patterns SP1*b*, and others of the plurality of second bridge patterns BR2 may be arranged to overlap the plurality of second sensing patterns SP2 in plan view. The plurality of second bridge patterns BR2 may be connected, through a contact hole, to the plurality of second sensing patterns SP2 disposed on a different layer.

One first sensing electrode TE1*b* of the plurality of first sensing electrodes TE1*b* may include a first mesh line MH1*b*, and one second sensing electrode TE2*b* of the plurality of second sensing electrodes TE2*b* may include a second mesh line MH2*b*.

The first mesh line MH1*b* and the second mesh line MH2*b* may be spaced apart from each other between two of the plurality of emission regions PXA that are adjacent to each other in the first direction DR1, and the first mesh line MH1*b* and the second mesh line MH2*b* spaced apart from each other may extend in the second direction DR2 in plan view. For example, the first mesh line MH1*b* and the second mesh line MH2*b* may be arranged between the two emission regions PXA of the plurality of emission regions PXA, which are adjacent to each other in the first direction DR1, and the first mesh line MH1*b* and the second mesh line MH2*b* may be arranged to be spaced apart from each other in the first direction DR1. The first mesh line MH1*b* and the second mesh line MH2*b* may be spaced apart from each other between the plurality of first connection parts CE1, CE2 and CE3.

The first mesh line MH1*b* and the second mesh line MH2*b* may be arranged to overlap the separator SPRa in plan view. The separator SPRa in FIG. 15 may have substantially the same shape as the separator SPRa illustrated in FIG. 14. Referring to FIG. 14, the separator SPRa may include a first separator SPR1, and a second separator SPR2 spaced apart from the first separator SPR1 in the first direction DR1. The first separator SPR1 may overlap the first mesh line MH1*b*, and the second separator SPR2 may overlap the second mesh line MH2*b*. That is, the first mesh line MH1*b* may be arranged to overlap the first separator SPR1 in plan view, and the second mesh line MH2*b* may be arranged to overlap the second separator SPR2 in plan view. The first mesh line MH1*b* may have a width that is the same as or narrower than a width of the first separator SPR1, and the second mesh line MH2*b* may have a width that is the same as or narrower than a width of the second separator SPR2.

According to the present disclosure, each of the plurality of first bridge patterns BR1*b* may be disposed to be spaced apart from the plurality of emission connection parts CE1, CE2 and CE3 with the emission region PXA therebetween. The first mesh line MH1*b* of the plurality of first sensing electrodes TE1*b* and the second mesh line MH2*b* of the plurality of second sensing electrodes TE2*b* may be spaced apart from each other in a region adjacent to the emission connection parts CE1, CE2 and CE3. Thus, influence due to an electric field fluctuation generated in the region adjacent to the emission connection parts CE1, CE2 and CE3 may be reduced, and touch noise caused by the electric field fluctuation may also be reduced.

The plurality of first and second sensing electrodes TE1b and TE2b may be disposed to overlap the separator SPRa on a plan view, and the width of each of the mesh lines MH1b and MH2b of the plurality of first and second sensing electrodes TE1b and TE2b may be the same as or narrower than the width of the separator SPRa. In this case, the plurality of first and second sensing electrodes TE1b and TE2b may have a minimized area overlapping the second electrode EL2_1, EL2_2 or EL2_3 (see FIG. 4B) of the light emitting device, to which a variable voltage is applied. Thus, coupling noise, which occurs between the plurality of first and second sensing electrodes TE1b and TE2b and the second electrode EL2_1, EL2_2 or EL2_3, may be reduced.

As described above, each of a plurality of first bridge patterns may be disposed to be spaced apart from a plurality of emission connection parts with an emission region therebetween. In addition, a first mesh line of a plurality of first sensing electrodes and a second mesh line of a plurality of second sensing electrodes may be spaced apart from each other in a region adjacent to the emission connection parts. Thus, an influence due to electric field fluctuation generated in the region adjacent to the emission connection parts may be reduced, and a touch noise caused by the electric field fluctuation may be reduced or removed.

The plurality of first and second sensing electrodes may be disposed to overlap a separator, and each of the mesh lines of the plurality of first and second sensing electrodes may have a width that is the same as or narrower than the width of the separator. In this case, the plurality of first and second sensing electrodes may have a reduced area overlapping a second electrode of a light emitting device, to which a variable voltage is applied. Thus, a coupling noise, which occurs between the plurality of first and second sensing electrodes and the second electrode, may be reduced.

Although the embodiments of the present invention have been described, it is understood that the present invention should not be limited to these embodiments but various changes and modifications can be made by one ordinary skilled in the art within the spirit and scope of the present invention as hereinafter claimed. Therefore, the technical scope of the inventive concept is not limited to the contents described in the detailed description of the specification, but should be determined by the claims.

What is claimed is:

1. A display device comprising:
   a display layer configured to display an image; and
   a sensing layer disposed on the display layer, and including a plurality of first sensing electrodes and a plurality of second sensing electrodes intersecting the plurality of first sensing electrodes, wherein the display layer comprises
      a transistor;
      a light emitting device including a first electrode, an intermediate layer disposed on the first electrode, and a second electrode disposed on the intermediate layer;
      a pixel defining film in which an emission opening portion above the first electrode is defined;
      a separator disposed on the pixel defining film and interrupting a continuous formation of the second electrode; and
      a connection wiring including a first connection part connected to the second electrode and a second connection part connected to the transistor, the connection wiring configured to electrically connect the light emitting device and the transistor to each other,
   wherein the plurality of first sensing electrodes and the plurality of second sensing electrodes overlap the separator.

2. The display device of claim 1, wherein the display layer further comprises
   an emission region corresponding to the emission opening portion is defined in the display layer.

3. The display device of claim 2, wherein each of the plurality of first sensing electrodes comprises a plurality of first sensing patterns and a plurality of first bridge patterns that are disposed on a different layer from the plurality of first sensing patterns,
   wherein adjacently-positioned first sensing patterns of the plurality of first sensing patterns are electrically connected to each other by two first bridge patterns of the plurality of first bridge patterns, and
   wherein ones of the two bridge patterns are spaced apart from each other by at least the emission region.

4. The display device of claim 3, wherein each of the plurality of first bridge patterns is spaced apart from a plurality of first connection parts with at least one emission region therebetween.

5. The display device of claim 3, wherein each of the plurality of first bridge patterns comprises a bending portion, and the bending portion has a width that is greater than a width of the emission region, when viewed on a plan view.

6. The display device of claim 3, wherein each of the plurality of second sensing electrodes comprises a plurality of sensing portions and a connection part electrically connected to the plurality of sensing portions, and
   the plurality of second sensing electrodes are disposed on the same layer as the plurality of first sensing patterns.

7. The display device of claim 2, wherein there are a plurality of emission regions, and each of the plurality of first sensing electrodes and the plurality of second sensing electrodes comprises mesh lines,
   wherein the mesh lines include a first mesh line of one first sensing electrode of the plurality of first sensing electrodes and a second mesh line of one second sensing electrode of the plurality of second sensing electrodes,
   wherein the second mesh line and the first mesh line are spaced apart from each other between two emission regions of the plurality of emission regions, the two emission regions being positioned adjacent to each other in a first direction,
   wherein each of the first mesh line and the second mesh line extends in a second direction crossing the first direction.

8. The display device of claim 7, wherein the first mesh line and the second mesh line are spaced apart from each other between a plurality of first connection parts.

9. The display device of claim 7, wherein the first mesh line and the second mesh line are spaced apart from each other in the second direction.

10. The display device of claim 9, wherein the first mesh line and the second mesh line overlap a first portion of the separator, which extends in the second direction.

11. The display device of claim 7, wherein each of a width of the first mesh line and a width of the second mesh line is the same as or narrower than a width of the separator.

12. The display device of claim 7, wherein the first mesh line and the second mesh line are spaced apart from each other in the first direction.

13. The display device of claim 12, wherein the separator comprises a first separator and a second separator spaced apart from the first separator in the first direction,
   wherein the first separator overlaps the first mesh line, and the second separator overlaps the second mesh line.

14. The display device of claim 13, wherein a width of the first mesh line is the same as or narrower than a width of the first separator, and a width of the second mesh line is the same as or narrower than a width of the second separator.

15. The display device of claim 2, wherein each of the plurality of second sensing electrodes comprises a plurality of second sensing patterns and a plurality of second bridge patterns, wherein the plurality of second bridge patterns are disposed on a different layer from the plurality of second sensing patterns,
   wherein second bridge patterns of the plurality of second bridge patterns electrically connect adjacently-positioned second sensing patterns of the plurality of second sensing patterns.

16. The display device of claim 15, wherein each of the plurality of second bridge patterns is spaced apart from a plurality of first connection parts by the emission region positioned therebetween.

17. The display device of claim 16, wherein portions of the adjacently-positioned second sensing patterns are spaced apart from each other between two connection parts of the plurality of first connection parts, which are adjacent to each other in a second direction, in the second direction.

18. A display device comprising:
   a display layer configured to display an image; and
   a sensing layer disposed on the display layer, and including a plurality of first sensing electrodes and a plurality of second sensing electrodes intersecting the plurality of first sensing electrodes,
   wherein the display layer comprises
      a transistor;
      a light emitting device including a first electrode, an intermediate layer disposed on the first electrode, and a second electrode disposed on the intermediate layer;
      a pixel defining film in which an emission opening portion above the first electrode is defined;
      a separator disposed on the pixel defining film and interrupting a continuous formation of the second electrode; and
      a connection wiring including a first connection part connected to the second electrode and a second connection part connected to the transistor, the connection wiring configured to electrically connect the light emitting device and the transistor to each other,
   wherein each of the plurality of first sensing electrodes and the plurality of second sensing electrodes includes mesh lines, and each of the mesh lines has a width that is the same to or narrower than a width of the separator.

19. The display device of claim 18, wherein:
   each of the plurality of first sensing electrodes comprises a plurality of first sensing patterns, and a plurality of first bridge patterns disposed on a different layer from the plurality of first sensing patterns, wherein adjacently-positioned first sensing patterns of the plurality of first sensing patterns are electrically connected to each other by two first bridge patterns of the plurality of first bridge pattern; and
   wherein each of the plurality of second sensing electrodes comprises a plurality of sensing portions and a connection part electrically connected to the plurality of sensing portions, and the plurality of second sensing electrodes are disposed on the same layer as the plurality of first sensing patterns.

20. The display device of claim 19, wherein the display layer further comprises
   an emission region corresponding to the emission opening portion is defined in the display layer.

21. The display device of claim 20, wherein each of the plurality of first bridge patterns is spaced apart from a plurality of first connection parts by the emission region positioned therebetween.

22. The display device of claim 20, wherein each of the plurality of first bridge patterns comprises a bending portion, and the bending portion has a width that is greater than a width of the emission opening portion, when viewed on a plan view.

23. The display device of claim 20, wherein there are a plurality of emission regions, wherein a first mesh line of one first sensing electrode of the plurality of first sensing electrodes and a second mesh line of one second sensing electrode of the plurality of second sensing electrodes are spaced apart from each other between two emission regions of a plurality of emission regions,
   wherein the two emission regions are adjacent to each other in a first direction, and each of the first mesh line and the second mesh line extends in a second direction crossing the first direction.

24. The display device of claim 23, wherein the first mesh line and the second mesh line are spaced apart from each other between a plurality of first connection parts.

25. The display device of claim 24, wherein:
   the first mesh line and the second mesh line are spaced apart from each other in the second direction; and
   the first mesh line and the second mesh line overlap a first portion of the separator, which extends in the second direction.

26. The display device of claim 24, wherein the first mesh line and the second mesh line are spaced apart from each other in the first direction, and the separator comprises a first separator and a second separator spaced apart from the first separator in the first direction,
   wherein the first separator overlaps the first mesh line, and the second separator overlaps the second mesh line.

27. The display device of claim 26, wherein a width of the first mesh line is the same as or narrower than a width of the first separator, and a width of the second mesh line is the same as or narrower than a width of the second separator.

28. The display device of claim 20, wherein:
   each of the plurality of first sensing electrodes comprises a plurality of first sensing patterns, and a plurality of first bridge patterns disposed on a different layer from the plurality of first sensing patterns, wherein two first sensing patterns of the plurality of first sensing patterns, which are adjacent to each other, are electrically connected to each other by two first bridge patterns of the plurality of first bridge pattern; and
   each of the plurality of second sensing electrodes comprises a plurality of second sensing patterns, and a plurality of second bridge patterns disposed on a different layer from the plurality of second sensing patterns, wherein two second sensing patterns of the plurality of second sensing patterns, which are adjacent to each other, are electrically connected to each other by two second bridge patterns of the plurality of second bridge pattern.

29. The display device of claim 28, wherein each of the plurality of second bridge patterns is spaced apart from a plurality of first connection parts by the emission region positioned therebetween.

30. The display device of claim 29, wherein portions of the two second sensing patterns are spaced apart from each other in a second direction and positioned between two connection parts of the plurality of first connection parts, wherein the two connection parts are adjacent to each other in the second direction.

31. An electronic device comprising:
a display device comprising:
a display layer configured to display an image; and
a sensing layer disposed on the display layer, and including a plurality of first sensing electrodes and a plurality of second sensing electrodes intersecting the plurality of first sensing electrodes, wherein the display layer comprises
a plurality of transistors;
a plurality of light emitting devices electrically connected to the plurality of transistors, respectively, wherein each of the plurality of light emitting devices includes a first electrode, an intermediate layer disposed on the first electrode, and a second electrode disposed on the intermediate layer;
a pixel defining film in which an emission opening portion above the first electrode is defined; and
a separator disposed on the pixel defining film and interrupting a continuous formation of the second electrode, wherein each of the plurality of first sensing electrodes comprises a plurality of first sensing patterns, and a plurality of first bridge patterns are disposed on a different layer from the plurality of first sensing patterns,
wherein adjacently-positioned first sensing patterns of the plurality of first sensing patterns are electrically connected to each other by two first bridge patterns of the plurality of first bridge patterns,
wherein each of the plurality of first bridge patterns is spaced apart from a plurality of first connection parts by an emission region corresponding to the emission opening portion positioned therebetween, and
wherein the plurality of first connection parts are each connected in a one-to-one correspondence to the plurality of second electrodes of the plurality of light emitting devices.

32. The display device of claim 1, wherein
the connection wiring includes a first layer, a second layer disposed on the first layer, and a third layer disposed on the second layer,
the first layer and the third layer each comprise titanium, the second layer comprises aluminum,
a side surface of the second layer is recessed with respect to the first and third layers, and
an end portion of the second electrode is in contact with the side surface of the second layer at a location external to the emission region in a plan view.

* * * * *